United States Patent [19]

Hasegawa et al.

[11] Patent Number: 5,256,897

[45] Date of Patent: Oct. 26, 1993

[54] OXIDE SUPERCONDUCTING DEVICE

[75] Inventors: Haruhiro Hasegawa, Kokubunji; Toshiyuki Aida, Chofu; Toshikazu Nishino, Kawasaki; Mutsuko Hatano, Kodaira; Hideaki Nakane, Hachioji; Tokuumi Fukazawa, Tachikawa, all of Japan

[73] Assignee: Hitachi, Ltd., Tokyo, Japan

[21] Appl. No.: 729,867

[22] Filed: Jul. 10, 1991

Related U.S. Application Data

[63] Continuation of Ser. No. 442,258, Nov. 28, 1989, abandoned.

[30] Foreign Application Priority Data

| Nov. 28, 1988 | [JP] | Japan | 68-298094 |
| Mar. 10, 1989 | [JP] | Japan | 1-056419 |
| Jul. 19, 1989 | [JP] | Japan | 1-184639 |
| Sep. 25, 1989 | [JP] | Japan | 1-246284 |

[51] Int. Cl.$^5$ .............. H01L 39/22; H01L 29/48; H01L 29/56; H01L 29/161
[52] U.S. Cl. .................... 257/613; 257/33; 257/34; 257/35; 257/36; 257/473; 257/485; 257/661; 257/662; 257/663; 505/1
[58] Field of Search .......... 357/5, 62; 257/33-36, 257/661-663, 613, 473, 485; 505/1

[56] References Cited

U.S. PATENT DOCUMENTS 4,962,086  10/1990  Gallagher et al. ............ 505/1

FOREIGN PATENT DOCUMENTS

| 0276746 | 8/1988 | European Pat. Off. |  |
| 0292125 | 11/1988 | European Pat. Off. | 357/5 |
| 0305167 | 3/1989 | European Pat. Off. |  |
| 0323342 | 7/1989 | European Pat. Off. | 357/5 |
| 0325765 | 8/1989 | European Pat. Off. |  |
| 0336505 | 10/1989 | European Pat. Off. | 357/5 |
| 56-80185 | 7/1982 | Japan | 357/5 |
| 63-239990 | 10/1988 | Japan |  |
| 64-53475 | 3/1989 | Japan | 357/5 |
| 1-102974 | 4/1989 | Japan | 357/5 |

OTHER PUBLICATIONS

P. Chaudhuri et al., "Critical Current Measurements and Epitaxial Films of YBa$_2$ Au$_3$O$_{7-x}$ Compound", *Physical Review Letters* vol. 58 (22 Jun., 1987) pp. 2684-2686.

Declaration of Makato SAHO and translation.

"Three-Terminal Superconducting Device Using a Si Single-Crystal Film", *IEEE Electron Device Letters*, vol. EDL-6, No. 6, Jun. 1985.

*Proceedings of the International Symposium on New Developments in Applied Superconductivity, Oct. 17-19, 1988, pp. 44-48, Osaka, Japan;* R. Aoki et al.: "Experimental Investigations for New Superconducting Mechanisms".

*Proceedings International Electron Devices Meeting*, Dec. 11, 1988, pp. 282-285, San Francisco, U.S.; A. Yoshida et al.: "Monolithic Device Fabrication Using High-Tc Superconductor".

Y. E. Nomoto et al. "Largely Anisotropic Superconducting Critical Current in Epitaxially Grown Ba$_2$YAu$_3$O$_{7-y}$ Thin Film", *Japanese Journal of Applied Physics*, (Jul. 26, 1987) L1248-L-1250.

*Physical Review* 148 (1966) pp. 280-286.

*Primary Examiner*—J. Carroll
*Attorney, Agent, or Firm*—Kenyon & Kenyon

[57] ABSTRACT

An oxide superconducting device has a junction structure composed of at least one oxide superconductor and at least one insulator in which carriers have been generated. As the insulator in which carriers have been generated, there can be used, for example, SrTiO$_3$ doped with Nb. With such a device, rectifying characteristics can be attained in the junction.

28 Claims, 16 Drawing Sheets

SAMPLE 1
Sr Ti O3 DOPED WITH Nb IN AN AMOUNT OF 0.05WT%

SAMPLE 2
Sr Ti O3 DOPED WITH Nb IN AN AMOUNT OF 0.5WT%

F I G. 32
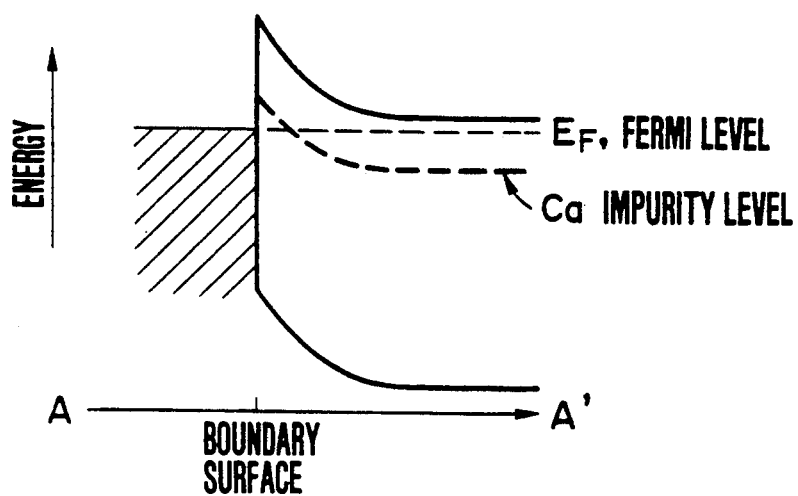
F I G. 33
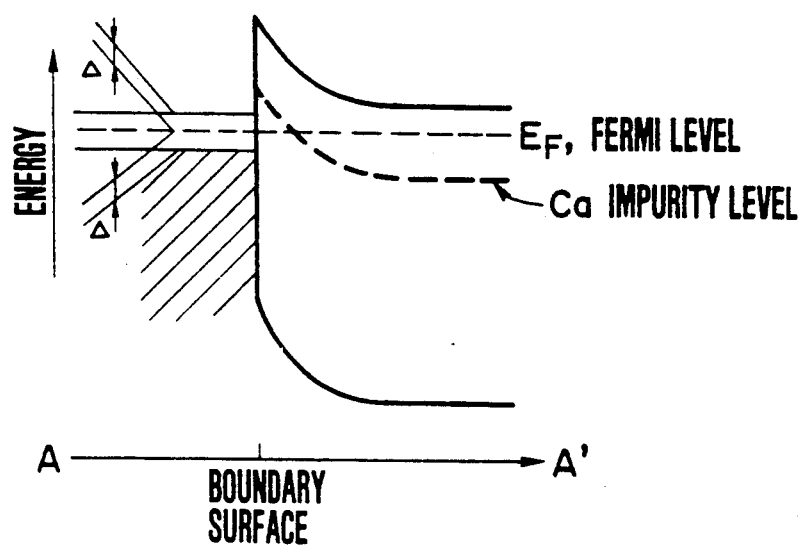
F I G. 34
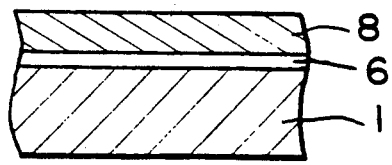

OXIDE SUPERCONDUCTING DEVICE

This application is a continuation of application Ser. No. 07/442,258, filed Nov. 28, 1989, now abandoned.

BACKGROUND OF THE INVENTION

The present invention relates to an oxide superconducting device obtained by combining an oxide superconductor with a semiconductor.

Oxide super conductors formed on $SrTiO_3$ (strontium titanate) substrates have been discussed in Jpn. J. Appl. Phys. 26 (1987) pp. L1248–L1250.

An oxide superconducting device having a junction structure composed of an oxide superconductor with a semiconductor different therefrom only in oxygen content has been disclosed in Jap. Pat. Appln. Kokai (Laid-Open) No. 63-239990.

On the other hand, $SrTiO_3$ doped with Nb has been discussed in Phys. Rev. 148 (1966) pp 280–286.

Oxide superconductors are selective in substrates, and sufficient superconducting properties can be attained only on a specific insulator substrate, e.g., a substrate of above $SrTiO_3$, MgO or YSZ (an abbreviation of yttrium stabilized zirconia,), or an $Al_2O_3$ substrate.

When a $SrTiO_3$ substrate is used, there can be attained junction of an oxide superconductor having excellent joining characteristics, with $SrTiO_3$. But $SrTiO_3$ is an insulator and no carrier exists therein. Therefore, although $SrTiO_3$ can be used as a substrate, i.e., support, for composing a device, $SrTiO_3$ cannot be positively utilized as a constituent having a function as element.

Accordingly, as described above, for example, semiconductors obtained from oxide superconductors by adjusting the oxygen content have heretofore been used for realizing an oxide superconducting device comprising an oxygen superconductor and a semiconductor combined therewith. An oxide superconductor undergoes a phase transition from superconductor phase to semiconductor phase when its composition is controlled. For example, Y—Ba—Cu—O, a so-called Y series superconductor, undergoes a phase transition from superconductor phase to semiconductor phase when the oxygen content is adjusted. Therefore, the above-mentioned oxide superconducting device comprising an oxide superconductor and a semiconductor combined therewith has been produced by properly controlling the oxygen content by heat treatment or plasma oxidation.

However, our investigation revealed the following facts. The above configuration involves a problem in that with a change of the oxygen content with the lapse of time, the position of a junction of the superconductor with the semiconductor changes with the lapse of time, or it involves a step difficult to control, i.e., heat treatment and therefore, for example, when a superconductor region and a semiconductor region are formed on the same plane, several-micrometers-order control of the positions of these regions is difficult. Furthermore, according to our investigation, the carrier concentration of the semiconductor phase of the oxide superconductor is about $1 \times 10^{21}$ ($1/cm^3$) which is high for a semiconductor, and therefore it is expected that when the semiconductor is joined to the oxide superconductor, the tunnel phenomenon is dominant in the resulting current-voltage characteristics at low temperatures of 100° K. or lower. In addition, there has not yet been obtained a metal/semiconductor junction device which exhibits rectifying characteristics at low temperatures of 100° K. or lower.

According to the configuration described above, when $SrTiO_3$ is doped with Nb, a mobility $\mu$ of 600 ($cm^2/V/sec$) is attained at a carrier concentration n of $1.7 \times 10^{20}$ ($1/cm^3$) and a temperature of 4.2° K. However, although such characteristics of simple $SrTiO_3$ doped with Nb have been known, characteristics, in particular, joint boundary surface characteristics, of a product obtained by combining Nb-doped $SrTiO_3$ with an oxide superconductor have not been known at all.

SUMMARY OF THE INVENTION

An object of this invention is to provide an oxide superconducting device obtained by junctioning an oxide superconductor with a semiconductor.

Other objects of the invention will be apparent from the following description.

For achieving the above object, the oxide superconducting device of the present invention is characterized by containing a junction structure composed of an oxide superconductor and a semiconductor and using as said semiconductor an impurity-doped insulator. The insulator enables said oxide superconductor to exhibit its superconductivity when the oxide superconductor is joined to the semiconductor. The oxide superconducting device of the present invention is composed using a carrier-induced insulator, as the semiconductor in the junction structure composed of the oxide superconductor and the semiconductor, so that the carrier may flow through the junction. As the insulator which permits exhibition of the superconductivity when the oxide superconductor is joined, it is preferable to use an insulator having a perovskite type crystal structure or a pseudoperovskite type crystal structure, more specifically, $SrTiO_3$. As the impurity used as a doping material, Nb is preferably used. From the view-point of high-speed operation of the device, it is preferable to use as the insulator, an oxide of a rare earth element and gallium which has a small dielectric constant, more specifically, $LaGaO_3$ or $NdGaO_3$. $LaAlO_3$, $AlGaO_3$, $KTaO_3$, $LiNBO_3$, etc. are also preferable. It is also possible to use a semiconductor which exhibits the semiconductor characteristics described above when doped with an impurity.

One embodiment of the device of the present invention is an embodiment in which the carrier concentration at room temperature of the semiconductor is adjusted to $1 \times 10^{21}$ ($1/cm^3$) or less.

Another embodiment of the device of the present invention is an embodiment in which the above structure is incorporated with a means for controlling carriers which pass through the semiconductor.

Another embodiment of the device of the present invention is an embodiment in which a buffer film is inserted between the oxide superconductor and the semiconductor which are joined to each other.

A still another embodiment of the device of the present invention is an embodiment in which the semiconductor has at least a junction structure composed of an n-type region with a p-type region.

When the insulator described above is doped with an impurity and then joined to an oxide superconductor, the insulator becomes electrically conductive by virtue of the doping with the impurity, namely, carriers are generated in the insulator. The insulator in which carriers have been generated has a high mobility of 100 ($cm^2/v.sec$) or more at 4.2° K., and it has a mobility of as high as 1000 (cm$^2$/v.sec) or more depending on the concentration of the impurity added as doping impurity. Therefore, when an oxide superconductor is combined with the semiconductor containing the carriers and the carriers are enabled to flow through the semiconductor, there can be realized an oxide superconducting device in which electroconductivity is present between the oxide superconductor and the semiconductor. Furthermore, the joining of the oxide, superconductor to the semiconductor results in the formation of a Schottky barrier in the junction. Therefore, a junction suitable for the oxide superconducting device can be attained by properly controlling the shape of energy band of the Schottky barrier by proper choice of the doping amount of the impurity.

In general, when a metal is joined to a semiconductor, a Schottky barrier is formed in the joint boundary surface. When the carrier concentration of the semiconductor is sufficiently high, for example, when it exceeds $1 \times 10^{21}$ (1/cm$^3$), this junction barrier is thin and carriers can tunnel through the junction barrier easily. In this case, tunnel phenomenon is dominant in the current-voltage characteristic between the joined metal and semiconductor, and the current-voltage characteristic diagram is symmetric with respect to the origin and shows a nonlinear characteristic. That is, it does not show rectifying characteristics which are such that the values of electric current in the positive voltage region and the negative voltage region are different. When the carrier concentration of the semiconductor is less than $1 \times 10^{21}$ (1/cm$^3$) the junction barrier is thick, and the current-voltage characteristic between the joined metal and semiconductor is assymmetrical with respect to the origin, resulting in appearance of rectifying characteristics. However, in the case of conventional semiconductors, when the carrier concentration is lowered to such a low value, carriers are frozen out accordingly as the temperature is lowered, so that the function of the device is lost. Therefore, it has heretofore been difficult to obtain a device which exhibits rectifying characteristics at low temperatures of about 100° K. or lower. In joining an oxide superconductor to a semiconductor, when the semiconductor phase of a high-temperature superconducting oxide is used as the semiconductor, only carrier concentration of the semiconductor of more than $1 \times 10^{21}$ (1/cm$^3$) can be attained. Therefore, it is contemplated that as a matter of course, there can be attained only a current-voltage characteristic between the joined oxide superconductor and semiconductor in which the tunnel phenomenon is dominant. However, according to the present invention, carriers are not frozen out at low temperatures of 100° K. or lower, and moreover when the carrier concentration is adjusted to $1 \times 10^{21}$ (1/cm$^3$) or less, there can be attained rectifying characteristics which are such that the values of electric current in the positive voltage region and the negative voltage region are different. Consequently, there can be realized a device which is excellent in input-output separation at low temperatures of about 100° K. or lower.

According to the present invention, a desired field effect can be obtained by controlling the carrier concentration by proper choice of the amount of the impurity added for doping the insulator or the semiconductor. In general, the smaller the doping amount of the impurity, the larger the field effect. More specifically, the carrier concentration of the insulator or semiconductor in which carriers have been generated is $1 \times 10$ (1/cm$^3$) or less, more preferably $1 \times 10^{21}$ (1/cm$^3$) or less.

When the doping amount of the impurity is in the above described range, the joint boundary surface characteristics between the oxide superconductor and the insulator in which carriers have been generated, and the superconducting characteristics of the oxide superconductor are substantially the same as those attained when there is used the original insulator which has not been doped. That is, the thickness of reaction product layer in the joint boundary surface and the critical temperature for superconductivity of the formed oxide superconductor are substantially the same as those attained when the original insulator is used.

In addition, the impurity element for doping the insulator is preferably such that the crystallographic properties of the original insulator which are advantageous for the superconducting characteristics of the oxide superconductor to be joined are not deteriorated by the doping. That is, it is preferable that the conditions such as ionic radius, coordination number, etc. of the impurity elements added as doping impurity are the same as or similar to those of the elements of the insulator which is replaced by the doping. Therefore, by choosing an impurity element satisfying these conditions, there can be realized an oxide superconducting device excellent in joint boundary surface characteristics between the oxide superconductor and the insulator doped with the impurity.

Between the oxide superconductor and the insulator in which carriers have been generated, a film of the oxide superconductor is formed, or a reaction product layer is formed by subsequent heat treatment. When the reaction product layer is so thin that the carriers can tunnel easily, the influence of the reaction product layer on the joint boundary surface characteristics is negligible. However, even when the reaction is suppressed by lowering the film-forming temperature and the heat treatment temperature, a Schottky barrier is formed in the joint boundary surface owing to the joining of the different materials. Schottky barrier is not desirable for obtaining an ohmic contact, but it is positively utilized in the gate electrode of MESFET. That is, by joining an oxide superconductor to an insulator in which carriers have been generated and enabling the carriers to flow in the insulator, there can be realized an oxide superconducting device utilizing a Schottky barrier formed at the junction of the oxide superconductor with the insulator in which carriers have been generated.

The formation of a buffer film between the oxide superconductor and the insulator in which carriers have been generated, serves to suppress the reaction of the oxide superconductor with the insulator in which carriers have been generated, and to adjust the height of the Schottky barrier. As a material for the buffer film, it is preferable to use a material which is not readily reactive with oxide superconductors or semiconductors, specifically, Au, Ag, Po or Pd. Of these, Au is particularly preferable. In obtaining an ohmic contact, it is effective to reduce the junction resistance between the buffer film and the semiconductor by carrying out heat treatment after joining the buffer film with a semiconductor. The heat treatment temperature is 300° to 600° C., more preferably 400° to 550° C. The heat treatment time is preferably approximately 1 to 2 hours.

When an oxide superconductor is joined to an insulator in which carriers have been generated, a Schottky barrier or an ohmic contact is formed in the joint boundary surface, as described above. A useful oxide superconducting device can be realized also by providing a means for controlling carriers which flow between the joined oxide superconductor, and insulator. More specifically, such a useful device can be realized by controlling the shape of the energy band of the insulator in which carriers have been generated, or by controlling the energy barrier formed in the junction of the oxide superconductor with the insulator in which carrier have been generated, thereby controlling carriers which tunnel through the energy barrier.

When a product obtained by joining an n-type semiconductor to a p-type semiconductor is used as the aforesaid semiconductor, the immediate vicinity of the joint surface becomes a depletion layer and no carrier is present therein. Thus, the metallic properties of degenerate semiconductor are diminished and the screening effect of carriers is inhibited. Therefore, employment of the joined product can realize a larger field effect than does employment of the n-type semiconductor or the p-type semiconductor alone.

In the case of a superconducting device obtained by combining a superconductor with a semiconductor in which carriers are present, for example, the device described in IEE Electron Device Lett. EDL6 (1985) pp. 297-299, i.e., a superconducting device comprising a Si substrate and a Pb-In alloy superconducting thin film formed thereon, a semiconductor Si is doped with an impurity B in a concentration of $8 \times 10^{19}$ (1/cm$^3$) to generate carriers, and a Pb-In alloy superconducting thin film is formed on the semiconductor. Superconducting wave function thereby penetrates into the Si substrate, and thus there is realized a superconducting device utilizing proximity effect. A material (a semiconductor) in which carriers are present is indispensable not only in a superconducting device utilizing proximity effect, i.e., the penetration of superconducting wave function from a superconductor to a semiconductor, but also in a superconducting device obtained by combining a superconductor with a semiconductor, for example, SUBSIT (superconducting base semiconductor isolated transistor) or SUBHET (superconducting base hot electron transistor), or a super-Schottky diode which is a two-terminal device obtained merely by joining a superconductor to a semiconductor and is useful as an electromagnetic wave detector or a mixer. That is, it is necessary that a suitable shape of energy band should be obtained for a semiconductor near the junction by properly adjusting the amount and concentration distribution of an impurity for generating carriers.

According to our investigation, in the case of an oxide superconductor, Si is not suitable as semiconductor. The reason for this is as follows. In general, a high-temperature superconducting oxide does not exhibit superconductivity on a Si substrate, and even when its superconductivity can be attained, the critical temperature for superconductivity is lower than that in the case of forming a film of the high-temperature superconducting oxide on a SrTiO$_3$ substrate under the same conditions. Furthermore, as to the quality of film of the oxide superconductor, no single crystal can be obtained on a Si substrate, while a single crystal epitaxial film can be obtained on a SrTiO$_3$ substrate. That is, the quality of film is lower on a Si substrate than on a SrTiO$_3$ substrate. Therefore, it seems probable that in the case of a Si substrate, some reaction product, for example, silicon oxide exists in the joint boundary surface between the substrate and the oxide superconductor. In other words, it is anticipated that when a Si substrate is used, an oxide superconductor which is inferior in not only superconductivity but also joint boundary surface characteristics to that obtained by the use of a SrTiO$_3$ substrate is obtained. Accordingly, employment of a Si substrate is considered unsuitable for realizing an oxide superconducting device comprising an oxide superconductor and a semiconductor combined therewith which is excellent in junction characteristics.

On the other hand, when the semiconductor phase of a high-temperature superconducting oxide is used as the semiconductor, the constituent elements of the superconductor and the semiconductor are the same, and hence it is anticipated that the amount of reaction product in the joint boundary surface between the superconductor and the semiconductor is small. However, even when the composition of the semiconductor phase of any high-temperature superconducting oxide is controlled, the carrier concentration of the semiconductor phase is more than $1 \times 10^{21}$ (1/cm$^3$) which is high for a semiconductor. Therefore, a current-voltage characteristic between the joined superconductor and semiconductor in which tunnel phenomenon is dominant is attained, and it is anticipated that no sufficient field effect can be obtained owing to the screening effect of carriers at a high carrier concentration. Furthermore, the semiconductor phase of any high-temperature superconducting oxide has a mobility of as low as about 1 (cm$^2$/V.sec) even when its composition is controlled.

The present invention was made on the basis of the above investigation of ours and provides an oxide superconducting device obtained by joining an oxide superconductor to a semiconductor which contains only small amount of reaction product in the joint boundary surface between them and is excellent in joint boundary surface characteristics.

BRIEF DESCRIPTION OF THE DRAWINGS

FIG. 1(a) and FIG. 19b) are cross-sectional views of a device of the first embodiment of the present invention. FIG. 32 and FIG. 33 are diagrams showing the energy bands of the device of the 9th embodiment of the present invention. FIG. 34 is a cross-sectional view of a device of the 10th embodiment of the present invention.

DETAILED DESCRIPTION OF THE PREFERRED EMBODIMENTS

Embodiments of the present invention are explained below with reference to the drawings.

First, the first embodiment of the present invention is explained below with reference to FIGS. 1 to 6 and FIGS. 43 to 46. In this embodiment, an oxide superconducting device was produced by doping an insulator $SrTiO_3$ with an impurity Nb to generate carriers therein, and joining an oxide superconductor to the doped insulator.

Figure 4A:
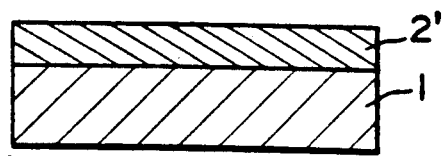
FIGS. 4(a)–4(d) are cross-sectional views showing a production process of the device of the first embodiment of the present invention.
Figure 4B:
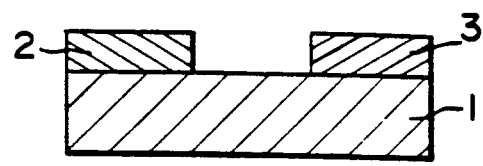
Figure 4C:
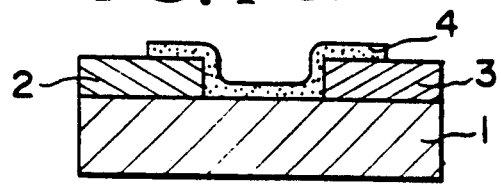
Figure 4D:
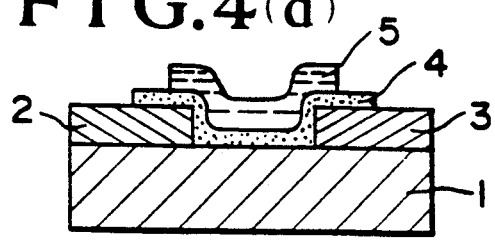
Figure 5A:
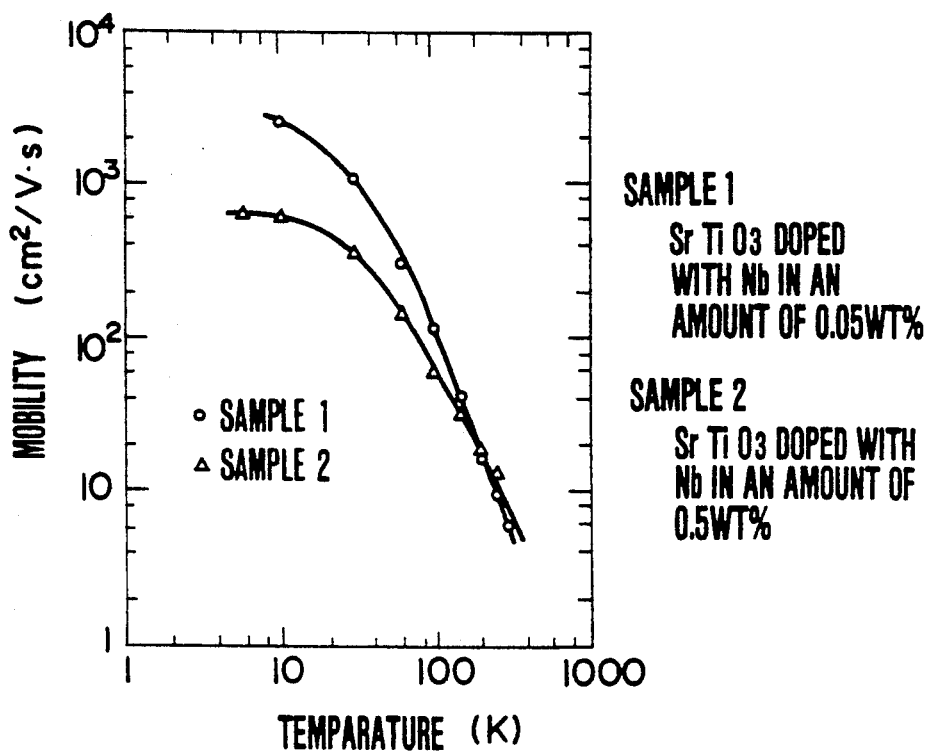
FIG. 5(a) is a diagram showing the temperature dependence of mobility of the device of the first embodiment of the present invention.
Figure 5B:
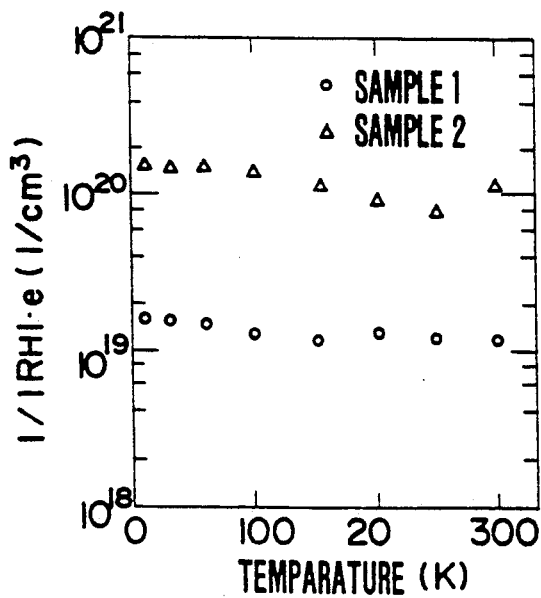
FIG. 5(b) is a diagram showing the temperature dependence of Hall coefficient of the device of the first embodiment of the present invention.
Figure 6A:
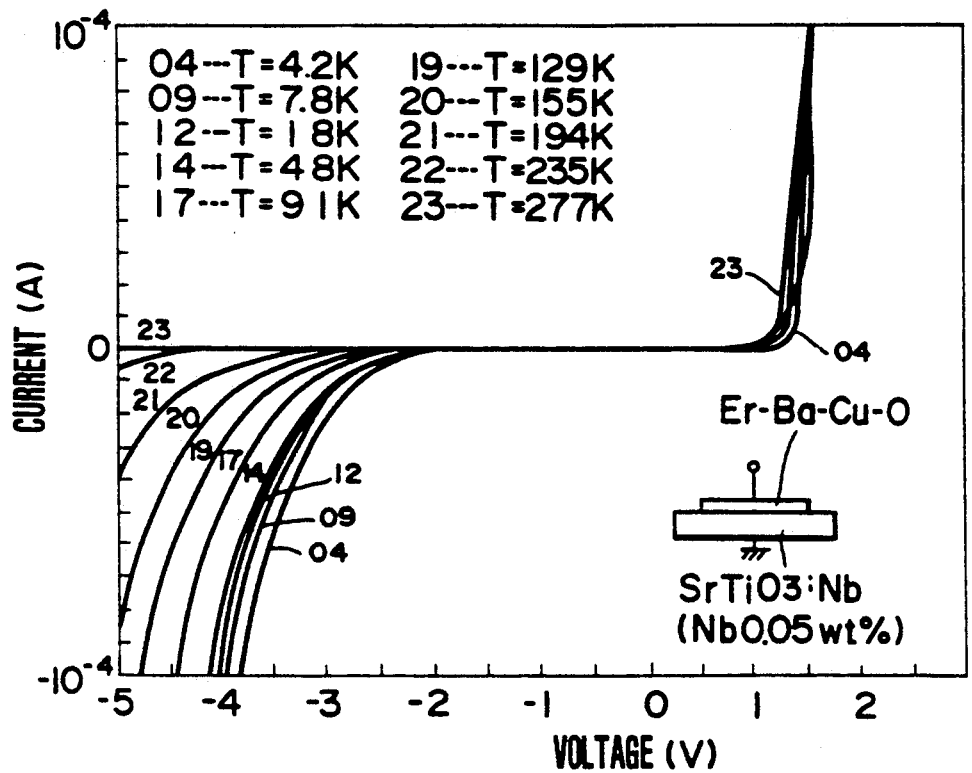
FIG. 6(a) and 6(b) are current-voltage characteristic diagrams of the device of the first embodiment of the present invention.
Figure 6B:
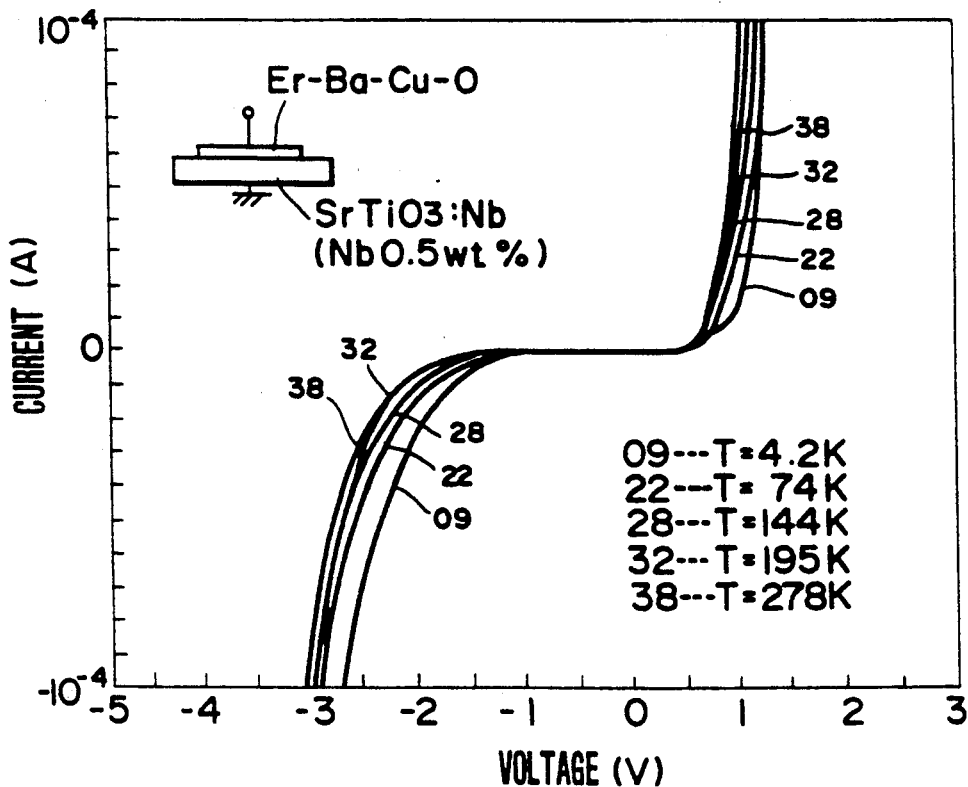
Figure 43:
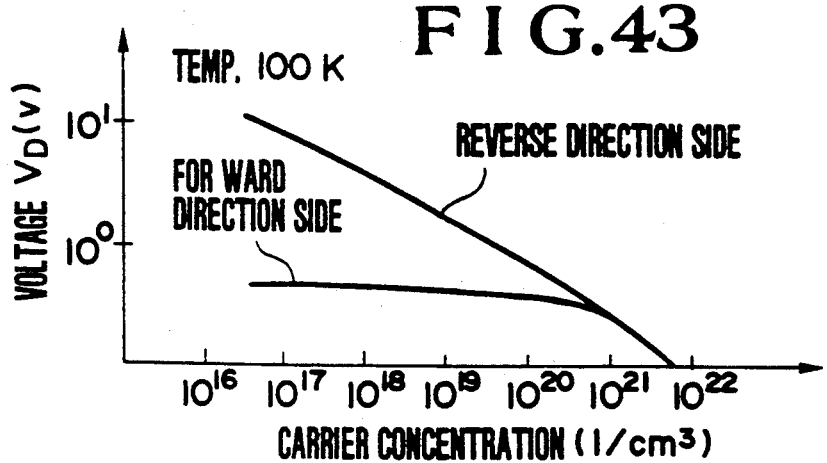
FIG. 43 is a graph showing the rectifying properties of junction of the device of the first embodiment of the present invention.

The doping of the insulator $SrTiO_3$ with the impurity Nb was conducted by mixing $Nb_2O_5$ with a starting material before growing $SrTiO_3$ crystals. The doping amount of Nb was 0.05 wt % or 0.5 wt %. The crystals obtained after growing was black, and their color increased in depth with an increase of the doping amount of Nb, indicating that the carrier concentration increased with the doping amount of Nb. FIGS. 5(a) and (b) show the temperature dependences of mobility and Hall coefficient, respectively, which were determined by Hall measurement. The Hall coefficient is negative and the carriers are electrons. Since the Hall coefficient is substantially constant independently of temperature, the $SrTiO_3$ doped with Nb can be said to be a degenerate semiconductor. Next, the $SrTiO_3$ crystals doped with Nb were cut into a wafer, and the surface of wafer was subjected to mirror polishing. Then, the surface of wafer was etched by immersion in hot phosphoric acid at 100° C. for 7 minutes to remove the contamination on the surface, crystal defect, distortion, etc., whereby there was obtained an insulator 1 in which carriers had been generated. Subsequently, the temperature of this substrate was raised to about 700° C., and an oxide superconductor 2' composed of an Er—Ba—Cu—O film was formed on the insulator 1 by high-frequency sputtering, whereby as shown in FIG. 4(a), there was formed a junction structure composed of the oxide superconductor and the insulator in which carriers had been generated. The critical temperature for superconductivity of the oxide superconductor 2' thus obtained was 75K as determined by measuring the resistivity, namely, there could be obtained substantially the same result as that obtained when an Er—Ba—Cu—O film was formed on a Nb-undoped $SrTiO_3$ substrate under the same conditions. From this fact, it was confirmed that the superconductivity of the film formed as oxide superconductor conductor on the Nb-doped $SrTiO_3$ substrate was as satisfactory as that of the film formed on a Nb-undoped $SrTiO_3$ substrate. Furthermore, in this case, it can be presumed that the amount of a reaction product in the joint boundary surface was small as in the case when the oxide superconductor of film form on a Nb-undoped $SrTiO_3$ substrate. FIGS. 6(a) and (b) show the results of measuring the temperature dependence of current-voltage characteristic between the joined materials, i.e., the oxide superconductor 2' of Er—Ba—Cu—O and the insulator 1 of Nb-doped $SrTiO_3$ in which carriers had been generated. The doping amount of Nb is 0.05 wt % for FIG. 6(a) or 5 wt % for FIG. 6(b). Rectifying action can be confirmed from FIGS. 6(a) and (b). The voltage in the case when the electric current density is $10^{-4}$ $(A/cm^2)$ is taken as Vo. FIG. 43 shows the carrier concentration dependence of Vo in the forward direction and reverse direction at a temperature of 100° K. which were determined from FIGS. 6(a) and (b). The area of junction is 0.01 $cm^2$ in FIG. 6(a) or 0.04 $cm^2$ in FIG. 6(b). When the carrier concentration is more than $10^{21}$ $(1/cm^3)$, Vo in the forward direction and Vo in the reverse direction are in substantial agreement with each other, indicating that the electric current flowing between the joined materials is due to the tunnel phenomenon. On the other hand, when the carrier concentration is less than $10^{21}$ $(1/cm^3)$, Vo in the reverse direction is higher than Vo in the forward direction, indicating rectifying characteristics. That is, rectifying characteristics suitable for a device utilizing input-output separation and rectifying action could be obtained at a low temperature of 100° K. by joining the oxide superconductor with Nb-doped $SrTiO_3$ and adjusting the carrier concentration of Nb-doped $SrTiO_3$ to $10^{21}$ $(1/cm^3)$ or less.

Figure 44:
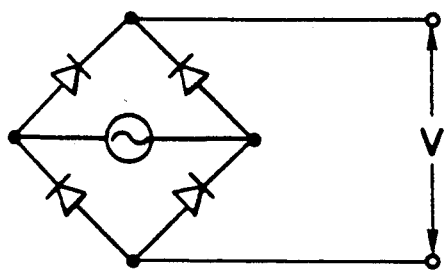
FIG. 44 is a diagram showing one example of electric circuit using the device of the first embodiment of the present invention.

FIG. 44 shows one example of circuit of a rectifier using the oxide superconductor/Nb-doped $SrTiO_3$ joined product produced in the present embodiment. By the use of four of the above joined products, an alternating current can be rectified to give a direct current of output V.

Figure 45:
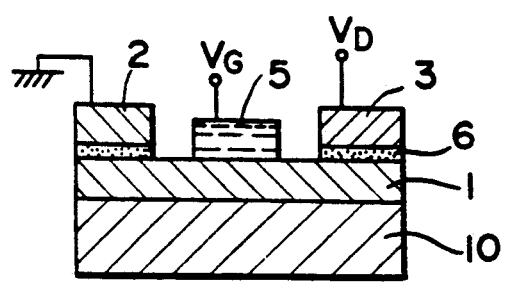
FIG. 45 is a cross-sectional view of the device of the first embodiment of the present invention.
Figure 46:
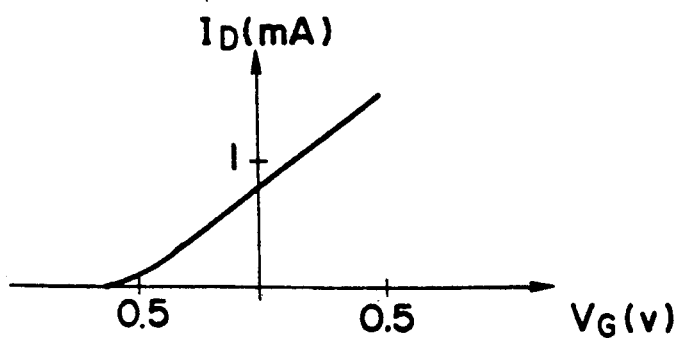
FIG. 46 is a characteristic graph of the device of the embodiment of the present invention.

FIG. 45 shows one example of MESFET using as MES gate the oxide superconductor/Nb-doped SrTiO$_3$ joined product obtained in the present embodiment. Nb-doped SrTiO$_3$ was formed into a film of 500Å in thickness on a nondoped SrTiO$_3$ (110) substrate 10 by sputtering to form an insulator 1 in which carriers had been formed. A Nb-doped SrTiO$_3$ sintered product was used as a target. Then, Au was formed into a film of 200Å in thickness partly on the Nb-doped SrTiO$_3$ film by a lift-off method by means of photolithography, whereby a buffer film 6 was formed. Subsequently, an oxide superconductor composed of an Er—Ba—Cu—O film was formed on the buffer film 6 by sputtering at a substrate temperature of 600° C., and then processed by photolithography to form a source superconducting electrode 2, a drain superconducting electrode 3 and a gate electrode 5. FIG. 46 shows gate voltage-drain current characteristic. Since there were rectifying characteristics between the gate electrode 5 and the insulator 1 in which carriers had been generated, there were attained, as shown in FIG. 46, drain current-gate voltage characteristic unsymmetrical with respect to the $I_D$ axis which is necessary for working of MESFET.

Although Nb-doped SrTiO$_3$ was used in the present embodiment, any other insulators in which carriers have been generated are, of course, also suitable so long as their concentration is $10^{21}$ (1/cm$^3$) or less.

In FIGS. 6(a) and (b), the breakdown voltage of characteristic in the reverse direction is lowered with a lowering of the temperature, and its temperature dependence tends to decrease with increasing of the doping amount of Nb. From this fact, it may be said that in this breakdown, avalanche breakdown is dominant and that Zener breakdown makes an additional contribution. The contribution of Zener breakdown tends to increase when the slope of the energy band forming a Schottky barrier between the joined materials becomes steeper with an increase of the doping amount of Nb.

Figure 1A:
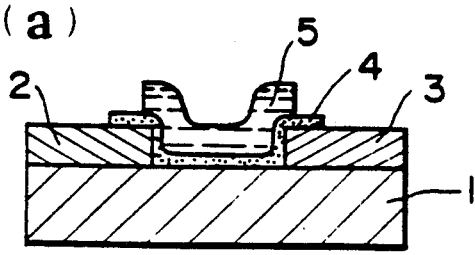
Figure 1B:
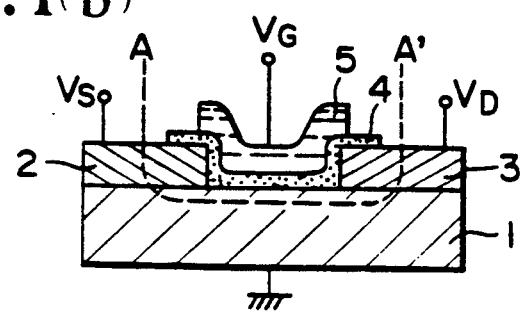

Next, one example of production of an oxide superconducting device utilizing such breakdown characteristics is explained below for the device shown in FIG. 1(a). As shown in FIG. 4(a), an oxide superconductor 2' composed of an Er—Ba—Cu—O thin film of 0.2 µm in thickness was formed on an insulator 1 composed of a substrate of SrTiO$_3$ doped with Nb in an amount of 0.05 wt % in which carriers had been generated. Then, the oxide superconductor 2' was processed by electron-beam lithography and Ar ion etching to form a source superconducting electrode 2 and a drain superconducting electrode 3 with the space of 0.2 µm between them (FIG. 4(b)). Subsequently, SiOx was evaporated to 100Å by a lift-off method to form a gate insulating film 4 (FIG. 4(c)). Then, PSG (phosphosilicate glass) was formed into a film of 0.2 µm in thickness by a CVD method and processed into a gate electrode 5 by photolithography (FIG. 4(d)). The gate electrode 5 was thus formed as a means for controlling carriers passing through the energy barrier in the junction structure portion between the oxide superconductor and the insulator in which carriers had been formed. Thus, there was obtained the oxide superconducting device shown in FIG. 1(a).

Figure 2A:
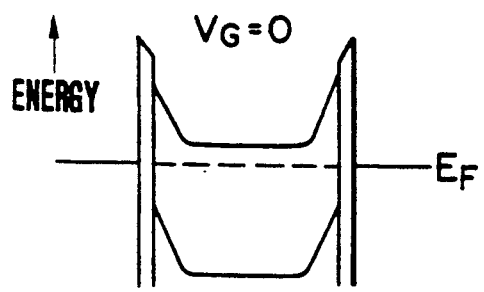
FIG. 2(a) and FIG. 2(b) are diagrams showing the energy bands of the device of the first embodiment of the present invention.
Figure 2B:
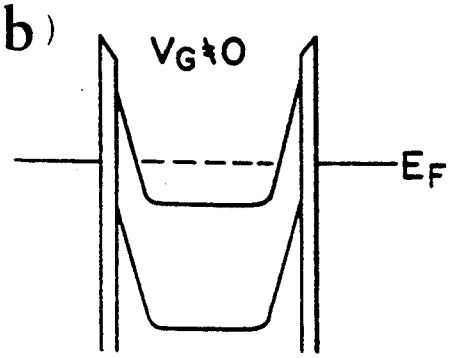
Figure 3A:
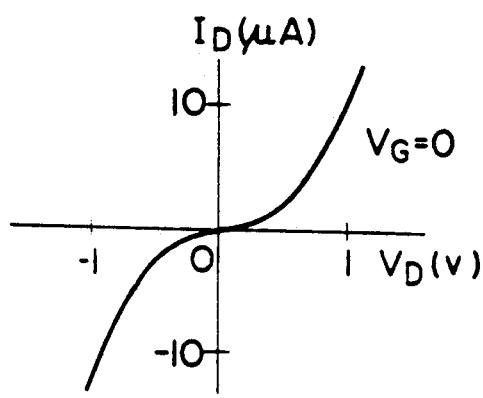
FIG. 3(a) and FIG. 3(b) are current-voltage characteristic graphs of the device of the first embodiment of the present invention.
Figure 3B:
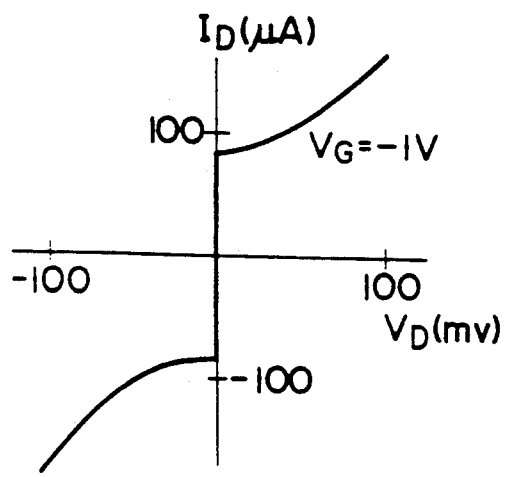

Next, the principle of working of this oxide superconducting device is explained below. At shown in FIG. 1(b), the gate voltage and the drain voltage are determined. An energy diagram between A and A' is shown in FIGS. 2(a) and (b). As shown in FIG. 2(a), when the gate voltage Vg is zero, the slope of the energy band forming a Schottky barrier between the joined materials is gentle, and the current-voltage characteristic between Vs and Vd is as shown in FIG. 3(a) and no supercurrent is observed. As shown in FIG. 2(b), when the gate voltage Vg is not zero, Vg is adjusted to lower than zero particularly in the case where a large number of carriers of the insulator 1 doped with an impurity are electrons as in Nb-doped SrTiO$_3$. In this case, the slope of the energy band forming a Schottky barrier between the joined materials is steep, resulting in an increase of the probability that the carriers tunnel through the Schottky barrier. In the case of a semiconductor having a high mobility, such as Nb-doped SrTiO$_3$ used in the present embodiment, the coherence length in the semiconductor is large, and increase of the carrier concentration due to the avalanche phenomenon also promotes increase of the coherence length in the semiconductor. Such an increase of the coherence length in the semiconductor and the above-mentioned increase of the probability of tunneling enables Cooper pairs of the oxide superconductor to tunnel through the Schottky barrier, so that a supercurrent flows between the source superconducting electrode 2 and the drain superconducting electrode 3. In fact, as shown in FIG. 3(b), a maximum supercurrent of about 80 µA was observed at a gate voltage Vg of $-1$ V. Thus, the drain voltage could be controlled by means of the gate voltage, whereby a three-terminal type oxide superconducting device could be realized. Needless to say, it is effective in achieving the object of the present invention, for example, to form a well region by forming a Nb-doped SrTiO$_3$ thin film on a SrTiO$_3$ substrate by sputtering in order to prevent leakage current on the substrate side.

In the present embodiment, an insulator SrTiO$_3$ was doped with an impurity Nb. Other impurities added to SiTiO$_3$ as doping materials were chosen as follows. As to the valence of the impurity elements added to the insulator as doping materials, the carrier concentration increases generally with an increase of the difference between the valence of an element of the original insulator which is replaced by doping and the valence of the impurity element as doping material. With an increase of this difference, the crystallinity of the insulator decreases and its matching with the oxide superconductor tends to decrease. Therefore, the carrier concentration can be increased by increasing the difference between the valences, and improvement of the superconducting characteristics and the boundary surface junction characteristics and reduction of the carrier concentration can be realized by reducing the difference between the valences. In general, with an increase of the amount of the impurity added to the insulator as an doping material, the carrier concentration increases, but the crystallinity of the insulator decreases and its matching with the oxide superconductor tends to be deteriorated. Therefore, the carrier concentration can be increased by increasing the doping amount of the impurity, and improvement of the superconducting characteristics and the boundary surface junction characteristics and reduction of the carrier concentration can be realized by reducing the doping amount of the impurity.

The impurity element(s) added as doping material(s) can be chosen, for example, as follows. As to the elements constituting SrTiO$_3$, according to Chemical Society of Japan, Kagaku Binran Kisohen II Third Revised Edition, Maruzen Co., Ltd. (1984), Ti exhibits a valence of 4 and $Ti^{4+}$ has an ionic radius of 0.75Å and a coordination number of 6. Therefore, as an impurity which replaces Ti of $SrTiO_3$ by doping, an element having an ionic radius near 0.76Å and a coordination number near 6 is preferred. For example, as element(s) having a valence of 6, it is preferable to use at least one member selected from the element group consisting of Sc having an ionic radius of 0.88Å and a coordination number of 6, Al having an ionic radius of 0.68Å and a coordination number of 6, Ga having an ionic radius of 0.76Å and a coordination number of 6, In having an ionic radius of 0.94Å and a coordination number of 6, and P having an ionic radius of 0.58Å and a coordination number of 6. As element(s) having a valence of 5, it is preferable to use at least one member selected from the element group consisting of V having an ionic radius of 0.68Å and a coordination number of 6, Ta having an ionic radius of 0.78Å and a coordination number of 6, Mo having an ionic radius of 0.75Å and a coordination number of 6, W having an ionic radius of 0.76Å and a coordination number of 6, As having an ionic radius of 0.60Å and a coordination number of 6, Sb having an ionic radius of 0.74Å and a coordination number of 6, and Bi having an ionic radius of 0.90Å and a coordination number of 6. Sr has a valence of 2 and an ionic radius of 1.32Å. Therefore, as an impurity which replaces Sr of $SrTiO_3$, it is preferable to use at least one member selected from the element group consisting of La having a valence of 3 and an ionic radius of 1.17Å, Ce having a valence of 3 and an ionic radius of 1.15Å, and Pr, Nd, Pm, Sm, Eu, Gd, Tb, Dy, Ho, Er, Tm, Yb and Lu. As an impurity which replaces the oxygen of $SiTiO_3$, it is preferable to use at least one element selected from halogens such as F, Cl, etc. The elements exemplified above are preferable because their ionic radius and coordination number are only slightly different from those of the respective atoms which are replaced by them, and they are suitable as impurities added to $SrTiO_3$ as doping materials.

Figure 7A:
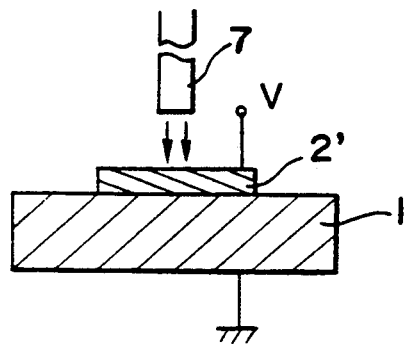
FIG. 7(a) and FIG. 7(b) are cross-sectional views of a device of the second embodiment of the present invention.
Figure 7B:
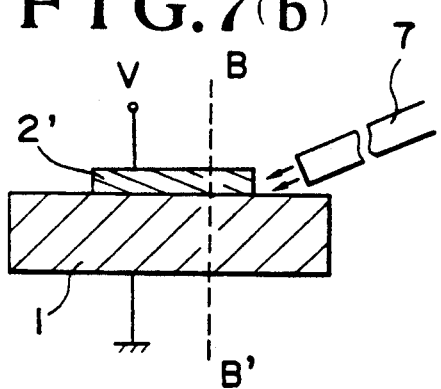
Figure 8:
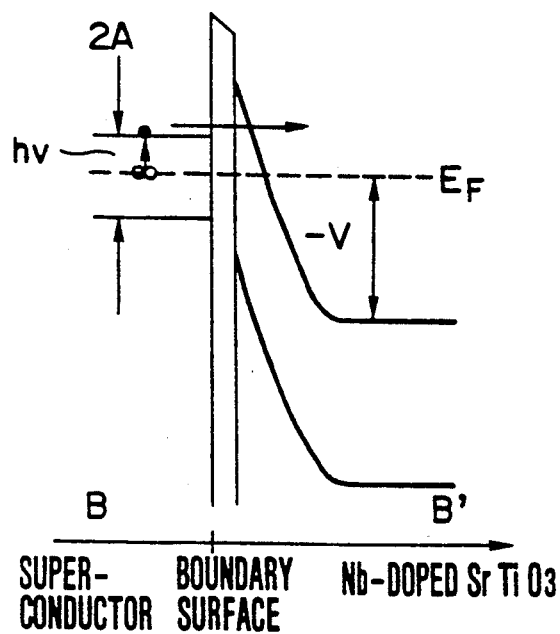
FIG. 8 is a diagram showing the energy band of the device of the second embodiment of the present invention.

Next, the second embodiment of the present invention is explained below with reference to FIG. 7 and FIG. 8. This embodiment is concerned with an electromagnetic wave detector. In the same manner as in the first embodiment of the present invention, an oxide superconductor 2' composed of an Er—Ba—Cu—O film of about 500Å was formed on an impurity-doped insulator 1 composed of $SrTiO_3$ doped with Nb in an amount of 0.05 wt %, by high-frequency sputtering. Thus, as shown in FIG. 7(a), there was formed a junction structure composed of the oxide superconductor 2' and the insulator in which carriers had been generated. The joined product thus obtained was cooled to a temperature lower than the critical temperature for superconductivity of the oxide superconductor 2' and irradiated with a far infrared ray having an energy of hν by means of an optical fiber from above the oxide superconductor 2'. Since the film thickness of the oxide superconductor 2' was as thin as about 500Å, the irradiated ray could be transmitted by the oxide superconductor 2' and reach the joint boundary surface between Nb-doped $SrTiO_3$ and the oxide superconductor. Alternatively, as shown in FIG. 7(a), the joined product was irradiated with a far infrared ray having an energy of hν from the side to allow the far infrared ray to reach the joint boundary surface. A voltage of V ($<0$) was applied to the oxide superconductor 2' with respect to the Nb-doped $SrTiO_3$ which had been earthened. A diagram showing energy band between B-B' in this case is shown in FIG. 8. Since the oxide superconductor 2' was in a superconducting state, a superconducting gap 2Δ exists with the Fermi energy EF as the center. When the energy hν of the irradiated far infrared ray is adjusted to the superconducting gap 2Δ or higher, Cooper pairs concentrated upon the Fermi energy are excited into quasi-particles. Since a voltage V ($<0$) was applied to the oxide superconductor 2', the slope of the energy band forming a Shottky barrier between the joined materials is steep, and quasi-particles generated are introduced into the Nb-doped $SrTiO_3$. The introduced quasi-particles are doubled by the avalanche phenomenon, resulting in a large output electric current. Thus, there can be realized an electromagnetic wave detector which is effective in detecting an electromagnetic wave, in particular, an electromagnetic wave having an energy near the energy gap 2Δ of the superconductor.

Figure 9:
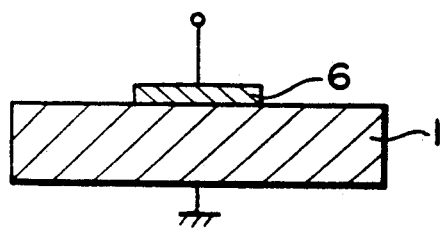
FIG. 9 and FIG. 11 are cross-sectional views of a device of the third embodiment of the present invention.
Figure 10A:
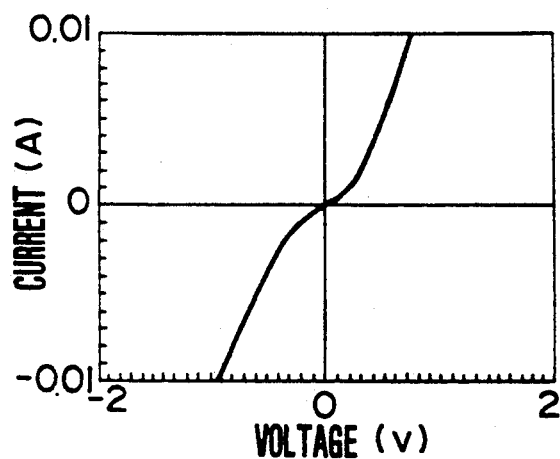
FIG. 10(a), FIG. 10(b) and FIG. 12 are current-voltage characteristic graphs of the device of the third embodiment of the present invention.
Figure 10B:
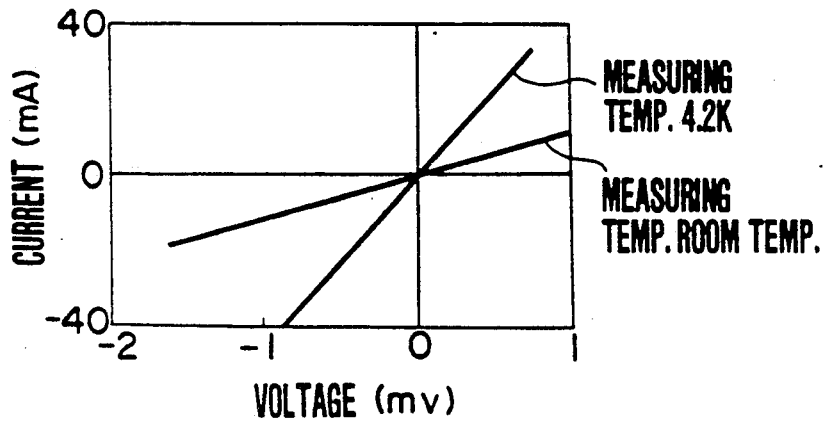

Next, the third embodiment of the present invention is explained with reference to FIG. 9 and FIG. 12. In this embodiment, the electroconductivity between the insulator in which carriers had been generated and an oxide superconductor was improved by forming a buffer film between them. An impurity-doped insulator 1 composed of $SrTiO_3$ doped with Nb in an amount of 0.5 wt % was formed in the same manner as in the first embodiment of the present invention. Then, an Au film of about 0.3 μm in thickness was formed as a buffer film 6 on the insulator 6 by the use of a mechanical mask, whereby there was formed a Au/Nb-doped $SrTiO_3$ junction having a joint area of about 0.1 $cm^2$ (FIG. 9). The current-voltage characteristic between the joined materials immediately after the formation of the Au film is shown in FIG. 10(a). The characteristic is nonlinear, indicating that an energy barrier exists between the joined materials. The joined product was then heat-treated under nitrogen at 450° C. for 2 hours. The current-voltage characteristic between the joined materials after the heat treatment is shown in FIG. 10(b). The measuring temperature was room temperature or 4.2K. The characteristic is linear, indicating that an ohmic contact was obtained. The resistance is about 0.02 Ω at 4.2K, indicating that a satisfactory junction could be obtained by the heat treatment.

Figure 11:
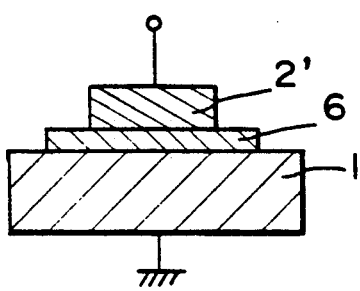

Subsequently, Au was formed into a film on a $SrTiO_3$ substrate doped with Nb in an amount of 0.5 wt %, and heat-treated in the same manner as described above, except for changing the thickness of Au film to 500Å. Then, in the same manner as in the first embodiment, Er—Ba—Cu—O was formed into a film on the Au film by high-frequency sputtering and processed by photolithography to form an oxide superconductor 2' (FIG. 11). The junction area between the oxide superconductor 2' and the buffer film 6 made of Au was about 0.001 $cm^2$. The current-voltage characteristic between the joined materials is shown in FIG. 12. The measuring temperature was 77K. From FIG. 12, it can be seen that the electric conductivity between the oxide superinsulator 2' and the impurity-doped insulator 1 composed of Nb-doped $SrTiO_3$ had been improved by the insulation of the buffer film 6 made of Au and the heat treatment. Although Au was used as the buffer film 6 in the present embodiment, there can also be used Ag, Pt and Pd which are stable and not easily reactive at high temperatures and permits penetration of a large amount of Cooper pairs by the proximity effect when joined to a superconductor.

Figure 13:
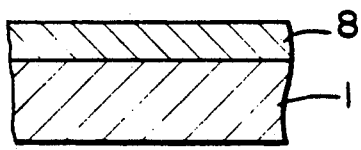
FIG. 13 and FIG. 15 are cross-sectional views of a device of the 4th embodiment of the present invention.
Figure 14:
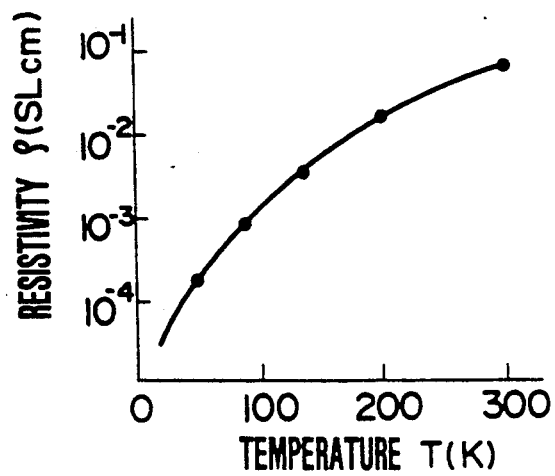
FIG. 14 is a diagram showing the temperature dependence of resistivity of the device of the 4th embodiment of the present invention.
Figure 15:
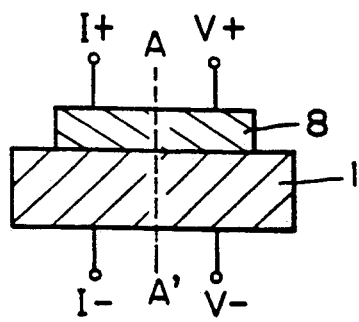
Figure 16:
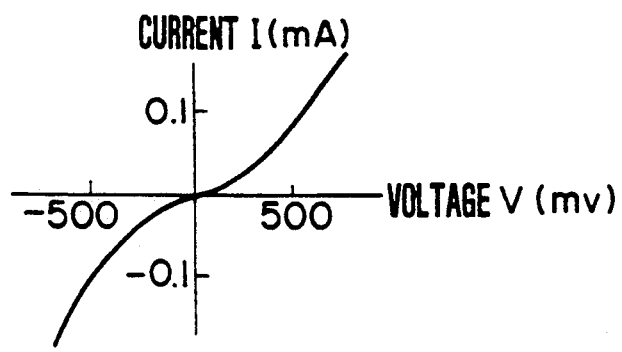
FIG. 16 is a current-voltage characteristic graph of the device of the 4th embodiment of the present invention.
Figure 17:
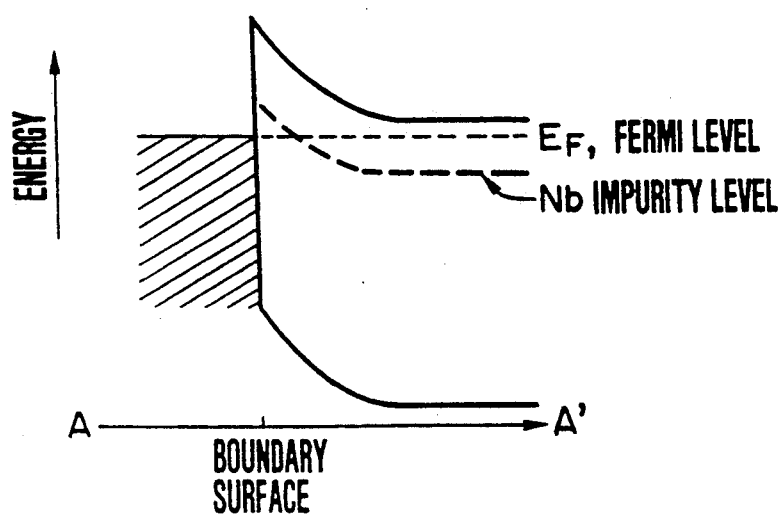
FIG. 17 and FIG. 18 are diagrams showing the energy bands of the device of the 4th embodiment of the present invention.
Figure 18:
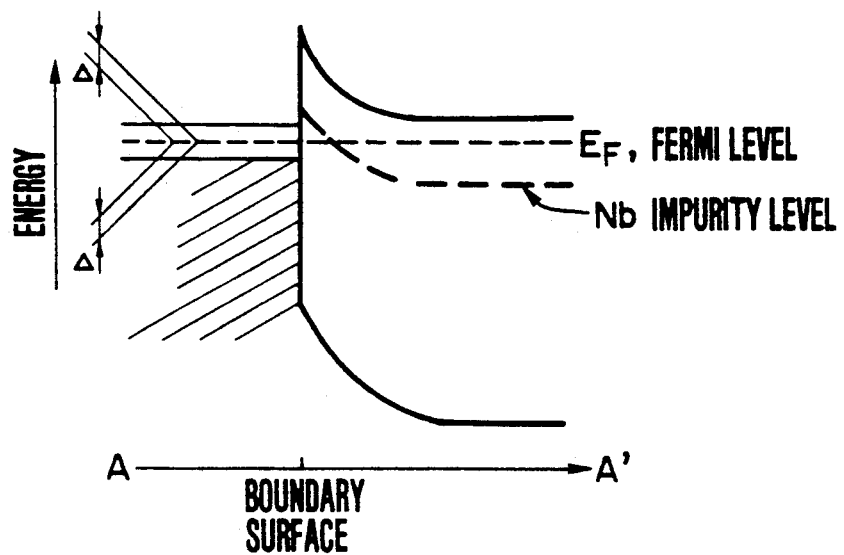

Next, the 4th embodiment of the present invention is explained below with reference to FIGS. 13 to 18. In this embodiment, carriers were generated in an insulator and an oxide superconducting film was formed on the insulator. For doping an insulator $SrTiO_3$ with an impurity Nb, $Nb_2O_5$ was mixed with $SrTiO_3$ at the time of growing $SrTiO_3$ crystals, to adjust the doping amount of Nb to 0.05 wt %. The crystals obtained after the growing were black and carriers existed therein evidently. As a result of Hall measurement by the van der Pauw method, the carriers were found to be electrons, namely, n-type carriers, and the carrier concentration n, the mobility $\mu$ and the resistivity $\rho$ were found to be $2.7 \times 10^{19}$ (1/cm$^3$), 195 (cm$^2$/V/sec) and $2.7 \times 10^{-3}$ ($\Omega$cm), respectively, at liquid nitrogen temperature. Then, the temperature dependence of the resistivity was measured by a four-probe technique. The results obtained are shown in FIG. 14. From FIG. 14, it can be seen that the resistivity decreases with a lowering of the temperature, namely, it shows metallic tendency, and that the Nb-doped $SrTiO_3$ is a degenerate semiconductor. The Nb-doped $SrTiO_3$ crystals were cut into a wafer, and the surface of wafer was subjected to mirror polishing. The surface of wafer was then etched by immersion in hot phosphoric acid at 100° C. for 7 minutes to remove the contamination on the surface, crystal defects, distortion, etc., whereby there was obtained an insulator 1 in which carriers had been generated. Subsequently, an oxide superconductor 8 composed of an Er—Ba—Cu—O film was formed on the insulator 1 by high-frequency sputtering, whereby as shown in FIG. 13, there was formed a junction structure composed of the oxide superconductor and the insulator in which carriers had been generated. The critical temperature for superconductivity of the oxide superconductor was 75K as determined by measuring the resistivity, namely, there could be obtained substantially the same result as that obtained when an Er—Ba—Cu—O film was formed on a Nb-undoped $SrTiO_3$ substrate under the same conditions. From this fact, it was confirmed that the superconductivity of the film formed on the Nb-doped $SrTiO_3$ substrate was as satisfactory as that of the film formed on a Nb-undoped $SrTiO_3$ substrate. Then, as shown in FIG. 15, the oxide superconductor 8 and the impurity-doped insulator 1 were provided with electrodes by using silver paste and ultrasonic In soldering, respectively, and the current-voltage characteristic was measured. The result obtained at room temperature is shown in FIG. 16. The characteristic is not linear, namely, not ohmic, and nonlinearity peculiar to diode characteristics can be confirmed. In this case, the electroconductivity, i.e., the resistance, between the oxide superconductor 8 and the insulator 1 in which carriers had been generated was about 5 K$\Omega$ at about 500 mV. FIG. 17 is a diagram showing energy band between A and A' in FIG. 15 presumed from the diode characteristics. The oxide superconductor, i.e., the A side, is metallic and occupied by electrons up to the Fermi level $E_F$. In the impurity-doped insulator, i.e., the A' side, there is a band gap in which an impurity level peculiar to the impurity Nb exists. Particularly when the temperature T is OK, the Fermi level $E_F$ can be considered to be situated between the lower end of the conduction band and the Nb impurity level. In the vicinity of the boundary surface between the oxide superconductor and the impurity-doped insulator, the band of the impurity-doped insulator is bent. It can be speculated that owing to the bending of the band, the current-voltage characteristic has nonlinearity peculiar to diode characteristics. Furthermore, the degree of the band bending varies depending on the doping amount of impurity and the position of impurity level which is peculiar to the kind of impurity. Therefore, suitable doping amount and kind of impurity are determined depending on desired functions of an element to be produced. For example, when the doping amount of Nb is larger than 0.05 wt % which is the doping amount of Nb employed in the present embodiment, the degree of the band binding becomes higher and field emission phenomenon due to tunneling becomes dominant. On the other hand, when the doping amount is reduced, the degree of the band bending becomes lower and thermoionic emission phenomenon becomes dominant. FIG. 18 is a presumed diagram showing energy band between A and A' in FIG. 15 at a temperature lower than the critical temperature for superconductivity of the oxide superconductor. In the oxide superconductor side, i.e., the A side, there is a gap of 2$\Delta$ ($\Delta$ refers to the energy gap of the oxide superconductor) at the Fermi level $E_F$. Consequently, super-Schottky characteristics based on $\Delta$ appear in the current-voltage characteristic, and needless to say, utilization of the super-Schottky characteristics makes it possible to realize, for example, an electromagnetic wave detector or a mixer.

In the present embodiment, the high-frequency sputtering was conducted for 3 hours and 20 minutes under the following conditions:atmosphere Ar:$O_2$=1:1, pressure 30 mm Torr, distance between substrate and target 3 cm, substrate-heating temperature 730° C. The film thickness of the oxide superconductor obtained was about 0.7 $\mu$m.

In the present embodiment, $SrTiO_3$ (lattice constant: 3.905Å) was used as insulator in which carriers had been generated and which was joined to the oxide superconductor. The lattice constant on the a-axis or the b-axis of the oxide superconductor was about 3.8Å for La—M—Cu—O (M=Ca, Sr, Ba) system, about 3.9Å for Ln—Ba—Cu—O (Ln=Y, La, Nd, Sm, Eu, Gd, Dy, Ho, Er, Tm, Yb, Lu) system, about 5.4Å for Bi—Sr—(Ca, Y)—Cu—O system, or about 5.4Å for Tl—Ba—Ca—Cu—O system. Therefore, as an insulator other than the above $SrTiO_3$, in which carriers have been generated and which is to be joined to the oxide superconductor, an insulator having a lattice constant not widely different from that of the above oxide superconductor is preferable because its lattice noncoherency at the time of joining is slight. The difference between the lattice constants of the insulator and the oxide superconductor is preferably 50% or less, more preferably 3% or less. Similarly, the difference between their expansion coefficients is preferably such that the one is, for example, less than 10 times, more preferably less than 2 times, as large as the other.

In the present embodiment, the surface of the wafer cut from $SrTiO_3$ crystals was etched with hot phosphoric acid, and then the oxide superconductor composed of an Er—Ba—Cu—O film was formed on the wafer by sputtering. On the other hand, it is known that impurity-undoped $SrTiO_3$ is electrically conductive even when it becomes deficient in oxygen owing to reduction treatment. Therefore, an insulator in which carriers have been generated can be combined with an oxide superconductor as in the present embodiment also by etching the surface of a SrTiO$_3$ wafer cut out, with hot phosphoric acid, conducting high-frequency sputtering, for example, under an Ar atmosphere to remove the contamination on the surface and cause oxygen deficiency, thereby inducing electroconductivity to the surface, and then forming an oxide superconductor of film form on the wafer.

In the present embodiment, an insulator SrTiO$_3$ was doped with an impurity Nb in an amount of 0.05 wt %. It is naturally difficult to determine definitely whether an impurity as doping material is introduced into any site of the original crystals by replacement or it is inserted between lattices without replacement, or determine which site of the original crystals the impurity is introduced into. However, when it is assumed that all the Nb atoms are introduced into the Ti site and the resulting product is represented by the formula Sr(Ti$_{1-x}$Nb$_x$)O$_3$, doping in an amount of 0.05 wt % is equivalent to doping at an x value of $\sim$0.001. In general, with an increase of the doping amount of impurity, i.e., an increase of the value of x, the carrier concentration increases. With a reduction of the amount of impurity, i.e., a reduction of the value of x, the carrier concentration decreases. Therefore, a suitable doping amount can be chosen depending on desired functions of a device to be produced. That is, there applies the same rule as in the case of the above-mentioned change of the degree of bending of the band with a change of the doping amount of impurity. In the present embodiment, the carrier concentration n, the mobility $\mu$ and the resistivity $\rho$ were $2.7 \times 10^{19}$ (1/cm$^3$), 195 (cm$^3$/V/sec) and $2.7 \times 10^{-3}$ ($\Omega$ cm), respectively, at liquid nitrogen temperature. The values of these properties can also be properly chosen depending on desired functions of a device to be produced. Although the above values are those of physical properties at liquid nitrogen temperature, as the same way as described above, the value of the physical properties can be chosen also at any of room temperature, liquid helium temperature, etc. Furthermore, although the present embodiment is concerned with the replacement of Ti by Nb in SrTiO$_3$, the same values of physical properties as described above can, of course, by chosen also for the replacement of Ti by an element other than Nb, the replacement of Sr or O in SrTiO$_3$ by Nb, or the replacement of an element constituting an insulator other than SrTiO$_3$ which enables an oxide superconductor to exhibit superconductivity, such as MgO, YSZ, Al$_2$O$_3$, etc.

Figure 19:
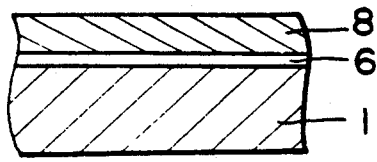
FIG. 19 is a cross-sectional view of a device of the 5th embodiment of the present invention.

Next, the 5th embodiment of the present invention is explained below with reference to FIG. 19. This embodiment is concerned with a joint boundary surface between an oxide superconductor and an insulator in which carriers have been generated, and it is useful particularly when the electroconductivity of surface of the insulator in which carriers have been generated is low. In the 4th embodiment, it was explained that it is possible to conduct high-frequency sputtering on an insulator in which carriers have been generated, under for example, an Ar atmosphere to remove the contamination on the insulator surface and cause oxygen deficiency, thereby induce electroconductivity to the insulator surface, and then form an oxide superconductor of film form. Although SrTiO$_3$ attains electroconductivity by oxygen deficiency, removal of surface layer by high-frequency sputtering is effective also in the case of an insulator which does not attain electroconductivity by oxygen deficiency and in which carriers have been generated, particularly when the electroconductivity of the insulator is low. The present embodiment is explained below.

High-frequency sputtering is conducted on a SrTiO$_3$ substrate doped with and impurity Nb in an amount of 0.1 wt %, under an Ar atmosphere at a pressure of 5 m Torr and at an output of 50 W for 10 minutes to remove the surface layer of the substrate, whereby there is obtained an insulator 1 in which carriers have been generated. Then, Au is formed into a film of about 20Å in thickness on the substrate by vacuum deposition without exposing the substrate to the air, whereby a buffer film 6 is formed. Owing to the above procedure, the surface of substrate is considered to have attained a sufficient electroconductivity. Subsequently, Y—Ba—Cu—O is formed into a film on the buffer film by microwave plasma reactive vacuum deposition to form an oxide superconductor 8. Since the buffer film 6 is as thin as about 20Å, the oxide superconductor 8 is affected by the substrate, i.e., the insulator 1 in which carriers have been generated, and it exhibits substantially the same superconducting characteristics as those attained when no buffer film is formed. That is, by virtue of the buffer film 6, the insulator 1 in which carriers have been generated and which is electrically conductive and suitable for joining can be obtained without deteriorating the superconducting characteristics of the oxide superconductor 8. Needless to say, the buffer film 6 serves to suppress the reaction of the oxide superconductor 8 with the insulator 1 in which carriers have been generated. A material for forming the buffer film 6 is not limited to Au and may be any of, for example, In, Nb, Ag, Cu, etc. The thickness of the buffer film 6 is preferably small for keeping the influence of the substrate, i.e., the insulator 1 in which carriers have been generated. It is preferably 1000Å or less, more preferably 20Å or less.

Figure 20:
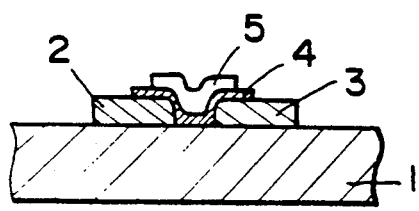
FIG. 20 is a cross-sectional view of a device of the 6th embodiment of the present invention.
Figure 21:
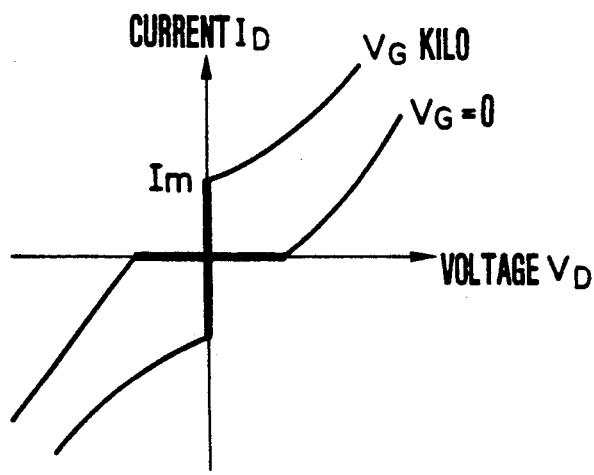
FIG. 21 is a current-voltage characteristic diagram of the device of the 6th embodiment of the present invention.
Figure 22:
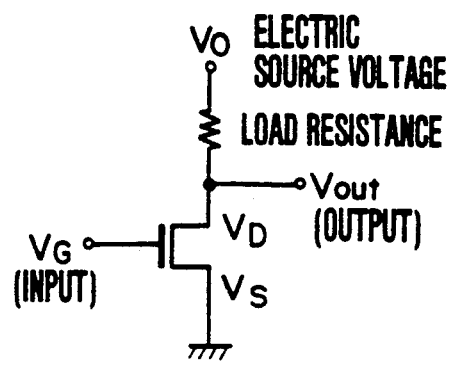
FIG. 22 is a diagram showing one example of inverter circuit using the device of the 6th of the present invention.

Next, the 6th embodiment of the present invention is explained below with reference to FIGS. 20 to 22. This embodiment is concerned with a superconducting transistor. SrTiO$_3$ doped with Nb in an amount of 0.05 wt % of plane orientation (100) is used as a substrate and made into an insulator 1 in which carriers have been generated. The surface of insulator 1 is sufficiently etched with hot phosphoric acid, and then an oxide superconductor composed of an Er—Ba—Cu—O film is formed on the substrate by high-frequency magnetron sputtering at a substrate-heating temperature of about 730° C. By coating a resist followed by processing by electron beam lithography and Ar ion etching, a source superconducting electrode 2 and a drain superconducting electrode 3 are formed to a width of about 5 $\mu$m with the space between them of about 0.2 $\mu$m. SiO$_x$ is formed to a thickness of about 50Å on the electrodes and the substrate by chemical vapor deposition to obtain a gate insulating film 4. Then, PSG (phosphosilicate glass) is formed to about 1000Å on the gate insulating film 4 by chemical vapor deposition to obtain a gate electrode 5. FIG. 21 shows the gate voltage V$_G$ dependence of drain current I$_D$-drain voltage V$_D$ characteristic of the superconducting transistor thus obtained. When V$_G$ is 0, no electric current flows between the source superconducting electrode 2 and the drain superconducting electrode 3. Thus, the superconducting transistor exhibits super-Schottky characteristics. When V$_G$ is not 0, a supercurrent having a maximum of Im flows between the source superconducting electrode 2 and the drain superconducting electrode 3. Using the super-conducting transistor thus obtained, an inverter logic can be realized, for example, by connecting a load resistance, as shown in FIG. 22.

In the present embodiment, the crystals of plane orientation (100) were used as a substrate. In this case, the oxide superconductor falls in c-axis orientation. The coherence length of the oxide superconductor is small in the c-axis direction and large in the a-axis and b-axis directions. The superconducting transistor is operated by controlling the amount of superconducting wave function penetrated from the superconductor to the semiconductor. Therefore, when the crystals of plane orientation (110) are used as a substrate and brought into a-axis and b-axis orientation, the amount of superconducting wave function penetrated to the semiconductor is increased, so that a superconducting transistor having a large amplification factor can be realized.

In the present embodiment, the space between the source superconducting electrode 2 and the drain superconducting electrode 3 was adjusted to about 0.2 µm. A space between them for making the device characteristics, e.g., the amplification factor the most suitable depends on the doping amount and the kind of impurity, etc. The space is preferably wide for facilitating the production but is preferably narrow for increasing the amount of superconducting wave function penetrated.

In the present embodiment, the widths of the source superconducting electrode 2 and the drain superconducting electrode 3 were adjusted to about 5 µm. Needless to say, increasing the widths is sufficient for increasing the maximum supercurrent Im, and reducing the widths is sufficient for reducing the maximum supercurrent Im.

Figure 23A:
FIGS. 23(a)-23(c) are cross-sectional views showing a production process of a device of the 7th embodiment of the present invention.
Figure 23B:
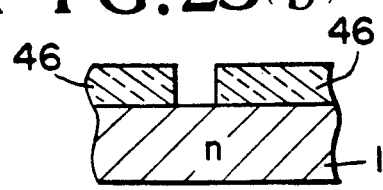
Figure 23C:
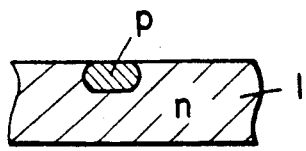

Next, the 7th embodiment of the present embodiment is explained below with reference to FIG. 23. This embodiment is concerned with a production process in which an n-type region or a p-type region is formed in a desired position. $SrTiO_3$ doped with Nb in an amount of 0.01 wt % at the time of growing crystals is cut out in a plane orientation (100), whereby as shown in FIG. 23(a), there is formed an insulator 1 of n-type in which carriers have been generated. Then, $SiO_x$ is formed on the insulator 1 by chemical vapor deposition (CVD), and a window is formed at a desired position by photolithography and dry etching with $CF_4$, whereby $SiO_x$ 46 is formed as shown in FIG. 23(b). Subsequently, Ga is implanted by an ion implantation method at an acceleration voltage of 10 kV, followed by etching the $SiO_x$. Thus, a p-type region can be formed in a desired position, as shown in FIG. 23(c). Needless to say, the depth of the p-type region can be controlled by varying the acceleration voltage for the ion implantation. Although, as an atom for giving $SrTiO_3$ of p-type, Ga was implanted in the present embodiment, after atoms such as Al or In Can also be used. As an atom for giving $SrTiO_3$ of n-type, Sb may be implanted. Since the ionic radius of these atoms is similar to that of Ti, these atoms bring about the same effects as obtained in the present embodiment.

Figure 24:
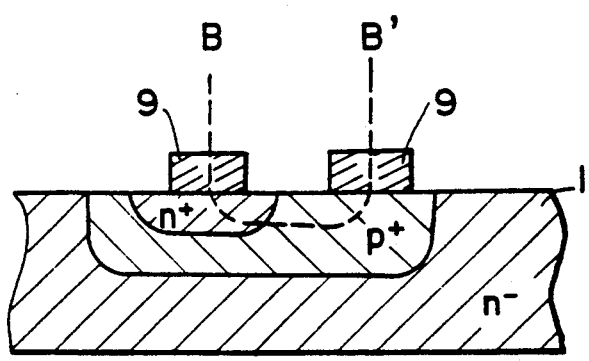
FIG. 24, FIG. 26 and FIG. 28 are cross-sectional views of a device the 8th embodiment of the present invention.
Figure 25:
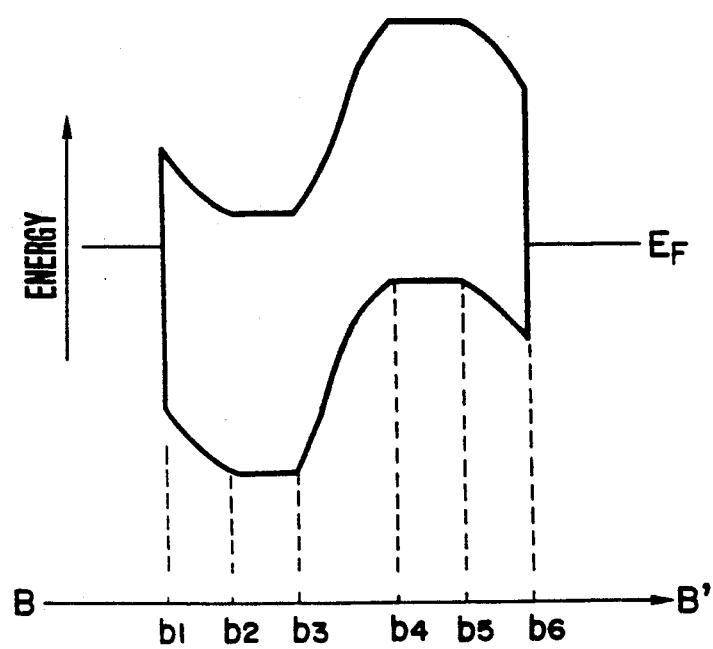
FIG. 25 and FIG. 27 are diagrams showing the energy bands of the device of the 8th embodiment of the present invention.
Figure 26:
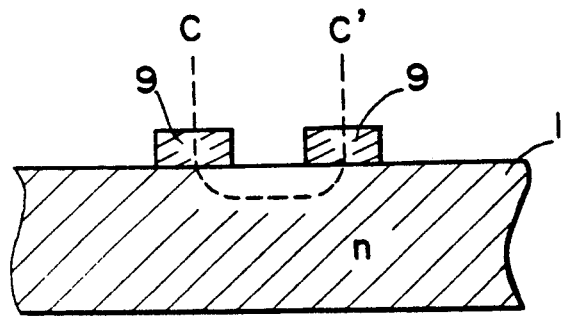
Figure 27:
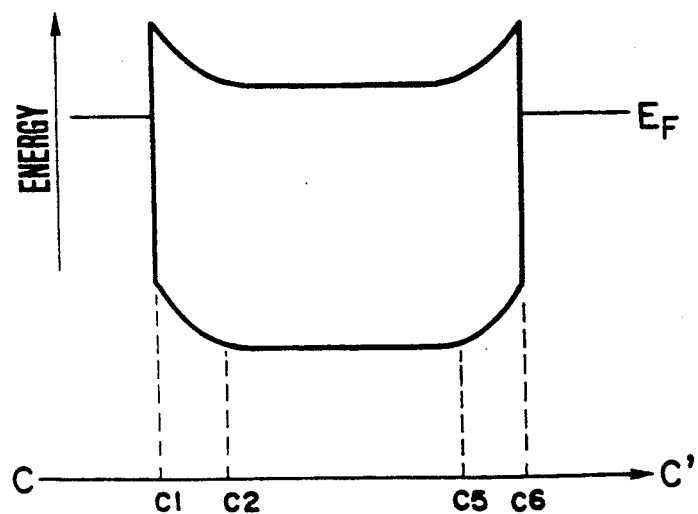

Next, the 8th embodiment of the present invention is explained below with reference to FIGS. 24 to 28. This embodiment is concerned with a junction structure composed of an oxide superconductor and a semiconductor containing a junction structure composed of n-type region and p-type region. In the same manner as in the 7th embodiment of the present invention, Ga is implanted by an ion implantation method in a $SrTiO_3$ substrate doped with Nb in an amount of 0.005 wt %, i.e., an insulator 1 in which carriers have been generated, whereby a p+ region is formed. Then, Sb is implanted in the p+ region in the same manner as above to form a n+ region. High-frequency sputtering is conducted on the insulator 1 under an Ar atmosphere and the surface of insulator 1 is washed. Thereafter, an oxide superconductor composed of an Y—Ba—Cu—O film of about 0.7 µm in thickness is formed on the insulator 1 by sputtering without exposing the insulator 1 to the air. After coating a resist, the oxide superconductor of Y—Ba—Cu—O is etched with about 0.3% nitric acid by a photolithographic method to form a superconducting electrode 9, whereby the device shown in FIG. 24 is obtained. FIG. 25 is a presumed diagram showing energy band between B and B' in FIG. 24. For comparison, FIG. 26 is a cross-sectional view of a junction structure composed of an oxide superconductor and a semiconductor which does not contain a junction structure composed of n-type region and p-type region but contains an n-type region alone. FIG. 27 is a presumed diagram showing energy band between C and C' in FIG. 26. Comparison between FIG. 25 and FIG. 27 indicates the following fact. In FIG. 25, there are more bends, namely, the depletion layer region is larger, and the screening effect is weaker, so that the effect of electric field is larger.

Figure 28:
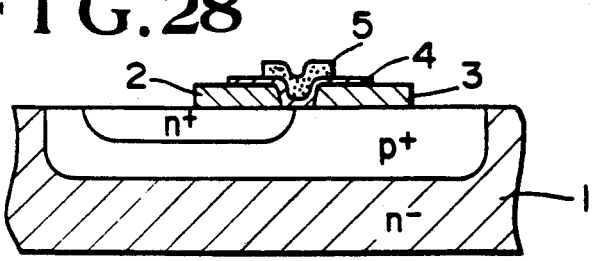

Next, in FIG. 28 is shown one embodiment of superconducting transistor in which an electric field is applied to a junction region of n-type region with p-type region which is provided in a semiconductor. A junction structure composed of n-type region and p-type region is formed in the same manner as in FIG. 24. A source superconducting electrode 2 and a drain superconducting electrode 3 are formed so as to be situated in the n-type region and the p-type region, respectively. Then, a gate insulating film 4 and a gate electrode 6 are formed to obtain the device shown in FIG. 28. In this case, a sufficient effect of electric field due to the gate voltage can be obtained, and hence a superconducting transistor having a large amplification factor can be realized.

Figure 29:
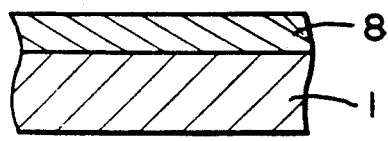
FIG. 29 and FIG. 30 are cross-sectional views of a device of the 9th embodiment of the present invention.
Figure 30:
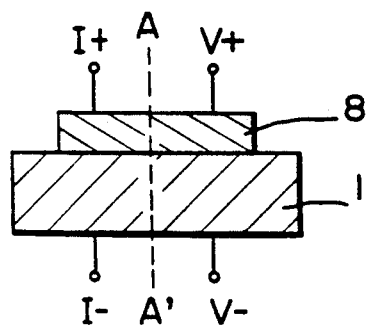
Figure 31:
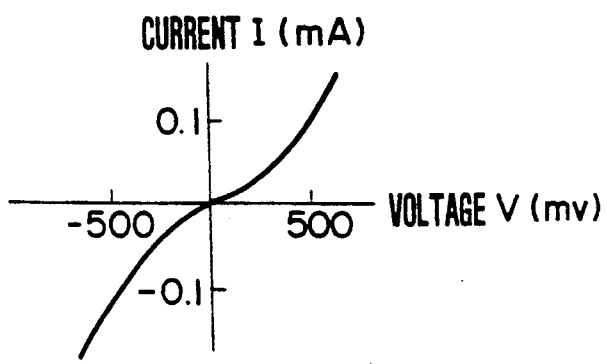
FIG. 31 is a current-voltage characteristic graph of the device of the 9th embodiment of the present invention.

Next, the 9th embodiment of the present invention is explained below with reference to FIGS. 29 to 33. In this embodiment, carriers are generated in an insulator and an oxide superconductor film is formed on the insulator. For doping an insulator $KTaO_3$ with an impurity Ca, $CaCO_3$ was mixed with $KTaO_3$ at the time of growing $KTaO_3$ crystals, so as to adjust the doping amount of Ca to 1 mol %. As a result of Hall measurement by the van der Pauw method, the carrier concentration n and the mobility µ were found to be $1 \times 10^{19}$ (1/cm$^3$) and 500 (cm$^2$/V/sec) at liquid nitrogen temperature. Then, the Ca-doped $KTaO_3$ crystals were cut into a wafer, and the surface of wafer was subjected to mirror polishing. The surface of wafer was etched by immersion in hot phosphoric acid at 100° C. for 7 minutes to remove the contamination on the surface, crystal defect, distortion, etc., whereby there was obtained an insulator 1 in which carriers had been generated. Subsequently, an oxide superconductor 8 composed of an Er—Ba—Cu—O film was formed on the insulator 1 by high-frequency sputtering, whereby as shown in FIG. 29, there was formed a junction structure composed of the oxide super-conductor and the insulator in which carriers had been generated. The critical temperature for superconductivity of the oxide superconductor thus obtained was 75K as determined by measuring the resistivity, namely, there could be obtained substantially the same result as that obtained when an Er—Ba—Cu—O film was formed on a Ca-undoped $KTaO_3$ substrate under the same conditions. From this fact, it could be confirmed that the superconductivity of the film formed as oxide superconductor on the Ca-doped $KTaO_3$ substrate was as satisfactory as that of the film formed on a Ca-undoped $KTaO_3$ substrate. Then, as shown in FIG. 30, the oxide superconductor 8 and the impurity-doped insulator 1 were provided with electrodes by using silver paste and ultrasonic In soldering, respectively, and the current-voltage characteristic was measured. The result obtained at room temperature is shown in FIG. 31. The characteristic is not linear, namely, not ohmic, and nonlinearity peculiar to diode characteristics can be confirmed. In this case, the electric conductivity, i.e., the resistance, between the oxide superconductor 8 and the insulator 1 in which carriers had been generated was about 5 k$\Omega$ at about 500 mV. FIG. 32 is a diagram showing energy band between A and A' in FIG. 30 presumed from the diode characteristics. The oxide superconductor, i.e., the A side, is metallic and occupied by electrons up to the Fermi level $E_F$. In the impurity-doped insulator, i.e., the A' side, there is a band gap in which an impurity level peculiar to the impurity Ca exists. Particularly when the temperature T is 0K, the Fermi level $E_F$ is considered to be situated between the lower end of the conduction band and the Ca impurity level. In the vicinity of the boundary surface between the oxide superconductor and the impurity-doped insulator, the band of the impurity-doped insulator is bent. It can be speculated that owing to the band bending, the current-voltage characteristic has nonlinearity peculiar to diode characteristics. Furthermore, the degree of the band bending varies depending on the doping amount of impurity and the position of impurity level which is peculiar to the kind of impurity. Therefore, suitable doping amount and kind of impurity are determined depending on desired functions of a device to be produced. For example, when the doping amount of Ca is larger than 1 mol % which is the doping amount of Ca employed in the present embodiment, the degree of the band bending becomes higher and field emission phenomenon due to tunneling becomes dominant. On the other hand, when the doping amount is reduced, the degree of the band bending becomes lower and thermoionic emission phenomenon becomes dominant. FIG. 33 is a presumed diagram showing energy band between A and A' in FIG. 30. In the oxide superconductor side, i.e., the A side, there is a gap of 2$\Delta$ ($\Delta$ refers to the energy gap of the oxide superconductor) at the Fermi level $E_F$. Consequently, super-Schottky characteristics based on $\Delta$ appear in the current-voltage characteristic, and needless to say, utilization of the super-Schottky characteristics makes it possible to realize, for example, an electromagnetic wave detector or a mixer.

In the present embodiment, the high-frequency sputtering was conducted for 3 hours and 20 minutes under the following conditions:atmosphere Ar:$O_2$=1:1, pressure 30 mm Torr, distance between substrate and target 3 cm, substrate-heating temperature 730° C. The film thickness of the oxide superconductor was about 0.7 $\mu$m.

In the present embodiment, $KTaO_3$ (lattice constant:3.9885Å) was used as insulator in which carriers had been generated and which was joined to the oxide superconductor. The lattice constant on the a-axis of the b-axis of the oxide superconductor was about 3.8Å for La—M—Cu—O (M=Ca, Sr, Ba) system, about 3.9Å for Ln—Ba—Cu—O (Ln=Y, La, Nd, Sm, Eu, Gd, Dy, Ho, Er, Tm, Yb, Lu) system, about 5.4Å for Bi—Sr—(Ca, Y)—Cu—O system, or about 5.4Å for Tl—Ba—Ca—Cu—O system. Therefore, as an insulator other than the above $KTaO_3$, in which carriers have been generated and which is to be joined to the oxide superconductor, an insulator having a lattice constant not widely different from that of the above oxide superconductor is preferable because its lattice noncoherency at the time of joining is slight. The difference between the lattice constants of the insulator and the oxide superconductor is preferably 50% or less, more preferably 3% or less. Similarly, the difference between their expansion coefficients is preferably such that the one is, for example, less than 10 times, more preferably less than 2 times, as large as the other.

In the present embodiment, the surface of the wafer cut from $KTaO_3$ crystals was etched with hot phosphoric acid, and then the oxide superconductor composed of an Er—Ba—Cu—O film was formed on the wafer by sputtering. On the other hand, impurity-undoped $KTaO_3$ is electrically conductive even when it becomes deficient in oxygen owing to reduction treatment. Therefore, an insulator in which carriers have been generated can be combined with an oxide superconductor as in the present embodiment also by etching the surface of a $KTaO_3$ wafer cut from, with hot phosphoric acid, conducting high-frequency sputtering, for example, under an Ar atmosphere to remove the contamination on the surface and cause oxygen deficiency, thereby inducing electroconductivity to the surface, and then forming an oxide superconductor of film form on the wafer.

In the present embodiment, an insulator $KTaO_3$ was doped with an impurity Ca in an amount of 1 mol %. It is naturally difficult to determine definitely whether an impurity as doping material is introduced into any site of the original crystals by replacement or it is inserted between lattices without replacement, or determine which site of the original crystals the impurity is introduced into. However, when it is assumed that all the Ca atoms are introduced into the K site, and the resulting product is represented by the formula $(K_{1-x}Ca_x)TaO_3$, increasing the doping amount of the impurity, i.e., increasing the value of x, results in increase of the carrier concentration, and reducing the doping amount of the impurity, i.e., reducing the value of x, results in decrease of the carrier concentration. Therefore, a suitable doping amount can be chosen depending on desired functions of a device to be produced. That is, this fact is equivalent to the above fact that the degree of the band bending changes with a change of the doping amount of the impurity. In the present embodiment, the carrier concentration n and the mobility $\mu$ were 1$\times$10$^{10}$ (1/cm$^3$) and 100 (cm$^2$/V/sec), respectively, at liquid nitrogen temperature. The values of these properties can also be properly chosen depending on desired functions of a device to be produced. Although the above values are those of physical properties at liquid nitrogen temperature, as the same way as described above, the same value of physical properties can be chosen also at any of room temperature, liquid helium temperature, etc. Furthermore, although the present embodiment is concerned with the replacement of K by Ca in $KTaO_3$, the same values of physical properties as described above can, of course, be chosen also for the replacement of K by an element other than Ca or the replacement of Ta or O in $KTaO_3$.

In addition, not only for a $KTaO_3$ insulator substrate but also for insulator substrates of $LaGaO_3$, $NdGaO_3$, $LaAlO_3$, $AlGaO_3$, $KTaO_3$ and $LiNbO_3$ which enables oxide superconductors to exhibit superconductivity, impurities for doping them can be chosen as follows, as for $SrTiO_3$ in the first embodiment of the present invention. According to Chemical Society of Japan, Kagaku Binran Kisohen II Third Revised Edition, Maruzen Co., Ltd. (1984), the elements constituting $LaGaO_3$, $NaGaO_3$, $LaAlO_3$, $AlGaO_3$, $KTaO_3$ and $LiNbO_3$ have the following properties. Ga exhibits a valence of 3, and $Ga^{3+}$ has an ionic radius of 0.76Å and a coordination number of 6. Al exhibits a valence of 3, and $Al^{3+}$ has an ionic radius of 0.68Å and a coordination number of 6. Ta exhibits a valence of 5, and $Ta^{5+}$ has an ionic radius of 0.78Å and a coordination number of 6. Nb exhibits a valence of 5, and $Nb^{5+}$ has an ionic radius of 0.78Å and a coordination number of 6. Therefore, as an impurity which replace the Ga site of $LaGaO_3$ or $NdGaO_3$ by doping, an element having an ionic radius near 0.76Å and a coordination number near 6 is preferred. For example, as element(s) having a valence of 2, it is preferable to use at least one member selected from the element group consisting of Co having an ionic radius of 0.79Å and a coordination number of 6.

Cu having an ionic radius of 0.87Å and a coordination number of 6,

Mn having an ionic radius of 0.81Å and a coordination number of 6, and

Ni having an ionic radius of 0.83Å and a coordination number of 6. As element(s) having a valence of 4, it is preferable to use at least one member selected from the element group consisting of Ir having an ionic radius of 0.77Å and a coordination number of 6, Ge having an ionic radius of 0.67Å and a coordination number of 6, Nb having an ionic radius of 0.82Å and a coordination number of 6, Ru having an ionic radius of 0.76Å and a coordination number of 6, Ti having an ionic radius of 0.75Å and a coordination number of 6, and Pb having an ionic radius of 0.92Å and a coordination number of 6. As an element having a valence of 5, Bi having an ionic radius of 0.90Å and a coordination number of 6 is preferred. La has a valence of 3 and an ionic radius of 1.17Å, and K has a valence of 1 and an ionic radius of 1.52Å. Therefore, as an impurity which replaces La or K in $LaAlO_3$ or $KTaO_3$, respectively, it is preferable to use at least one member selected from the element group consisting of Mg having a valence of 2 and an ionic radius of 0.86Å, Ca having a valence of 2 and an ionic radius of 1.14Å, Sr having a valence of 2 and an ionic radius of 1.32Å, and Ba having a valence of 2 and an ionic radius of 1.49Å. As an impurity which replaces oxygen in any of the above six compounds, it is preferable to use at least one element selected from halogens such as F, Cl, etc. The elements exemplified above are preferable because their ionic radius and coordination number are only slightly different from those of the respective atoms which are replaced by them, and they are suitable as impurities added as doping agents to $LaGaO_3$, $NaGaO_3$, $LaAlO_3$, $AlGaO_3$, $KTaO_3$ or $LiNbO_3$.

Next, the 10th embodiment of the present invention is explained below with reference to FIG. 34. This embodiment is concerned with a joint boundary surface between an oxide superconductor and an insulator in which carriers have been generated, and it is useful particularly when the electroconductivity of surface of the insulator in which carriers have been generated is low. In the 9th embodiment, it was explained that it is possible to conduct high-frequency sputtering on an insulator in which carriers have been generated, under for example, an Ar atmosphere to remove the contamination on the insulator surface and cause oxygen deficiency, thereby induce electroconductivity to the insulator surface, and then form an oxide superconductor of film form. Although $LaGaO_3$ attains electroconductivity by oxygen deficiency, removal of surface layer by high-frequency sputtering is effective also in the case of an insulator which does not attain electro-conductivity by oxygen deficiency and in which carriers have been generated, particularly when the electroconductivity of the surface is low. The present embodiment is explained below.

High-frequency sputtering is conducted on a $LaGaO_3$ substrate doped with an impurity Ge in an amount of 2 mol % under an Ar atmosphere at a pressure of 5 m Torr and at an output of 50 W for 10 minutes to remove the surface layer of the substrate, whereby there is obtained an insulator 1 in which carriers have been generated. Then, Au is formed into a film of about 20Å in thickness on the substrate by vacuum deposition without exposing the substrate to the air, whereby a buffer film 6 is formed. Owing to the above procedure, the surface of substrate is considered to have attained sufficient electroconductivity. Subsequently, Y—Ba—Cu—O is formed into a film on the buffer film by microwave plasma reactive vacuum evaporation to form an oxide superconductor 8. Since the buffer film 6 is as thin as about 20Å, the oxide superconductor 8 is affected by the substrate, i.e., the insulator 1 in which carriers have been generated, and it exhibits substantially the same superconducting characteristics as those attained when no buffer film is formed. That is, by virtue of the buffer film 6, the insulator 1 in which carriers have been generated and which is electrically conductive and suitable for joining can be obtained without deteriorating the superconducting characteristics of the oxide superconductor 8. Needless to say, the buffer film 6 serves to suppress the reaction of the oxide superconductor 8 with the insulator 1 in which carriers have been generated. The height of a Schottky barrier formed in a metal-semiconductor junction depends on the difference between the respective intrinsic work functions of the metal and the semiconductor. Both the buffer film 6 and the oxide superconductor 8 are metals, and when an ohmic contact is obtained, the height of the Schottky barrier is determined by the buffer film 6 and the insulator 1 in which carriers have been generated. Therefore, a desired height of Schottky barrier can be realized by choosing a metal having a suitable work function, as a material for the buffer film 6. A material for forming the buffer film 6 is not limited to Au and may be any of, for example, Ag, Pt, In, Nb, Cu, etc. The thickness of the buffer film 6 is preferably small for keeping the influence of the substrate, i.e., the insulator 1 in which carriers have been generated. It is preferably 1000Å or less, more preferably 20Å or less.

Figure 35A:
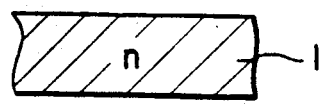
FIGS. 35(a)-35(c) are cross-sectional views showing a production process of a device of the 11th embodiment of the present invention.
Figure 35B:
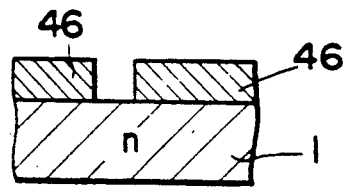
Figure 35C:
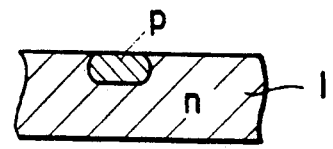

Next, the 11th embodiment of the present invention is explained below with reference to FIG. 35. This embodiment is concerned with a production process in which a region in which carriers are present is formed in a desired position. KTaO$_3$ doped with Ca in an amount of 0.1 mol % at the time of growing crystals is cut out in a plane orientation (100), whereby as shown in FIG. 35(a), there is formed an insulator 1 of n-type in which carriers have been generated. Then, SiO$_x$ is formed on the insulator 1 by chemical vapor deposition, and a window is formed in a desired position by photolithography and dry etching with CF$_4$, whereby SiO$_x$ 46 is formed as shown in FIG. 35(b). Subsequently, Ga is implanted by an ion implantation method at an acceleration voltage of 10 kV, followed by etching the SiO$_x$. Thus, a p-type region can be formed in a desired position, as shown in FIG. 35(c). Needless to say, the depth of the p-type region can be controlled by varying the acceleration voltage for the ion implantation properly. Although, as an atom for giving KTaO$_3$ of p-type, Ga was implanted in the present embodiment, other atoms such as Al or In may be implanted. As an atom for giving KTaO$_3$ of p-type, Sb may be implanted. Since the ionic radius of these atoms is similar to that of Ta, these atoms bring about the same effects as obtained in the present embodiment.

Figure 36:
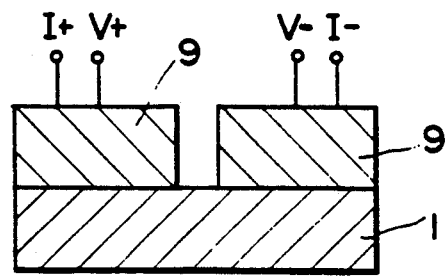
FIG. 36 is a cross-sectional view of a device of the 12th embodiment of the present invention.
Figure 37:
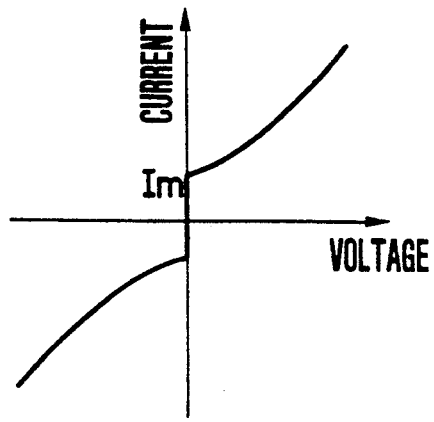
FIG. 37 is a current-voltage characteristic diagram of the device of the 12th embodiment of the present invention.

Next, the 12th embodiment of the present invention is explained below with reference to FIG. 36 and FIG. 37. In FIG. 36) reverse sputtering was conducted as reduction treatment on a SrTiO$_3$ single crystal substrate of (100) plane orientation to obtain an insulator 1 in which carriers had been generated. The reverse sputtering was conducted at an Ar pressure of 40 mm Torr and an output of 300 W for 3 hours by means of a high-frequency sputtering apparatus having a diameter of target plate of 15 cm. Oxygen deficiency is considered to have been caused thereby in the SrTiO$_3$ substrate. After the reverse sputtering, the substrate was black and its resistance was of the order of several ohms as determined by two-probe measurement. Thus, carriers had apparently be generated in the SrTiO$_3$ substrate. Although the high-frequency sputtering was conducted in Ar gas in the present embodiment, other suitable gases may, of course, be used. For example, a mixed gas of Ar and oxygen may be used so long as carriers are generated in the SrTiO$_3$ substrate. Needless to say, the number of carriers to be generated in the SrTiO$_3$ substrate can be properly varied by choosing the sputtering conditions such as gas pressure, output, time, etc. properly. The thus reduced SrTiO$_3$ substrate was relatively stable as follows. It was heat-treated in the air in order to remedy the lattice defects caused by the high-frequency sputtering. In the case of heat treatment at 400° C., the substrate was remained black and hence its oxygen deficient content was considered not to be changed. In the case of heat treatment at 1100° C., the substrate regained its original color, i.e., white. Therefore, at least heat treatment of 1100° C. or higher is considered to result in incorporation of oxygen, reduction of the oxygen deficiency, and recovery of the initial oxygen content. However, when the substrate is heat-treated in vacuo, oxygen is not incorporated even by heat treatment at higher than 100° C., and hence a higher heat treatment temperature can be employed. Thus, the reduced SrTiO$_3$ substrate was relatively stable to heat treatment. An oxide superconducting thin film of Y—Ba—Cu—O was formed on the SrTiO$_3$ substrate reduced by the high-frequency sputtering, by a reactive evaporation method at a substrate temperature of 500° C. The thus formed Y—Ba—Cu—O thin film untreated with heat had a critical temperature for superconductivity of 81K as determined by measuring the temperature dependence of the resistivity. Then, patterning was conducted by the use of an AZ type resist, followed by etching with 1% nitric acid, whereby a pair of superconducting electrodes 9 were formed with the space of about 0–5 μm between them. Subsequently, the current-voltage characteristic was measured by a four-probe technique by passing an electric current between the superconducting electrodes 9 in liquid nitrogen. The result obtained is shown in FIG. 37. From FIG. 37, it can be seen that a supercurrent having a maximum of Im flows between the superconducting electrodes 9. That is, there can be confirmed proximity effect, i.e., penetration of superconducting wave function from the superconducting electrodes 9 to the insulator 1 in which carriers had been generated. Needless to say, formation of suitable gate electrode and gate insulating film permits control of the amount of superconducting wave function penetrated to the SrTiO$_3$ substrate, namely, realization of a three-terminal type oxide superconducting device. In the present embodiment, a SrTiO$_3$ substrate of (100) plane orientation was used. Therefore, the oxide superconducting thin film of Y—Ba—Cu—O was in c-axis orientation. The coherence lengths of the Y—Ba—Cu—O oxide superconductor were $\xi ab \approx 30$Å in the direction of inside the ab-plane and $\xi c \approx 5$Å in the c-axis direction. Thus, the coherence length was shorter in the c-axis direction. Therefore, when an impurity is present in the boundary surface between SrTiO$_3$ substrate and the Y—Ba—Cu—O oxide superconducting thin film formed thereon, the penetration of superconducting wave function into SrTiO$_3$ substrate occurs more readily in (110) SrTiO$_3$ substrate in which the c-axis is directed inside the substrate surface, than in (100) SrTiO$_3$ substrate of c-axis orientation. That is, (110) SrTiO$_3$ substrate is advantageous for the penetration of superconducting wave function.

Although the reduction was carried out by high-frequency sputtering in the present embodiment, the object of the present invention can, of course, be achieved also by reducing a substrate by annealing under hydrogen or nitrogen or in vacuo because oxygen deficiency is considered to cause generation of carriers in SrTiO$_3$.

Next, the 13th embodiment of the present invention is explained below. In this embodiment, a SrTiO$_3$ substrate was doped with an impurity Nb to generate carriers in the SrTiO$_3$ substrate. Nb was deposited to about 20Å on a SrTiO$_3$ substrate by electron beam evaporation under a high vacuum of about $1 \times 10^{-10}$ Torr, and then the substrate was annealed under the high vacuum at a substrate temperature of about 1100° C. for 128 hours to diffuse Nb on the surface into the SrTiO$_3$ substrate. Since carriers exist in the SrTiO$_3$ substrate thus doped with Nb, an oxide superconducting device utilizing the proximity effect can be realized as in the 12th embodiment of the present invention by forming an oxide superconducting thin film on the Nb-doped substrate. Although the doping with Nb was conducted under the above conditions in the present embodiment, the Nb concentration distribution in SrTiO$_3$ and the concentration of generated carriers can, of course, be properly varied by varying the thickness of a Nb film to be formed, the substrate temperature, and the heating temperature properly. Although a SrTiO$_2$ substrate was doped with Nb in the present embodiment, the object of the present invention can, of course, be achieved also by doping the SrTiO$_3$ substrate with other impurities, for example, Ta so long as carriers are generated in the SrTiO$_3$ substrate. In the doping method used in the present invention, the doping is conducted by diffusion and hence the impurity is nonuniformly diffused in the depth direction. For diffusing an impurity uniformly, it is, of course, sufficient that there is employed, for example, a method comprising previously mixing the impurity with a starting material at the time of growing a SrTiO$_3$ single crystal. As the impurity to be mixed, Nb, Ta, etc. which have an ionic radius near the ionic radius 0.69Å of Ti are suitable.

Figure 38:
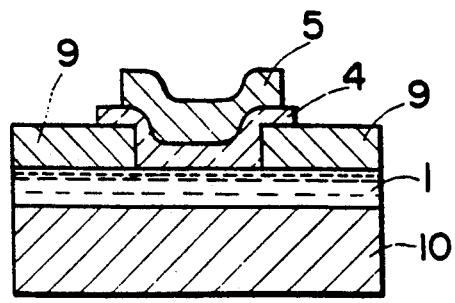
FIG. 38 is a cross-sectional view of a device of the 14th embodiment of the present invention.

Next, the 14th embodiment of the present invention is explained below with reference to FIG. 38. A (100) SrTiO$_3$ substrate was used as substrate 10, and a Nb-doped SrTiO$_3$ thin film of 100Å in thickness was formed on the substrate 10 by sputtering using Nb and SrTiO$_3$ as targets, whereby there was obtained an insulator 1 in which carriers had been generated. Then, an oxide superconducting thin film of Y—Ba—Cu—O of about 2000Å in thickness was formed on the insulator 1 by sputtering at a substrate temperature of 600° C. Patterning was performed by electron-beam lithography, followed by dry etching, whereby superconducting electrodes 9 were formed. Subsequently, SiO$_2$ was formed into a film of 200Å in thickness by a CVD method to form a gate electrode 4, and polycrystalline silicon was formed thereon by a CVD method to obtain a gate electrode 5. Consequently, a supercurrent flows between the superconducting electrodes 9 through the Nb-doped SrTiO$_3$ 1. The magnitude of the supercurrent can be controlled by means of a gate voltage applied to the gate electrode 5. In the present embodiment, the Nb-doped SrTiO$_3$ 1 was joined to the SrTiO$_3$ substrate 10, and the very thin SrTiO$_3$ layer of 100Å in thickness was used as a channel. Therefore, electrons which pass through the channel behave as two-dimensional electron gas, so that a high mobility can be attained with slight scattering.

Figure 39:
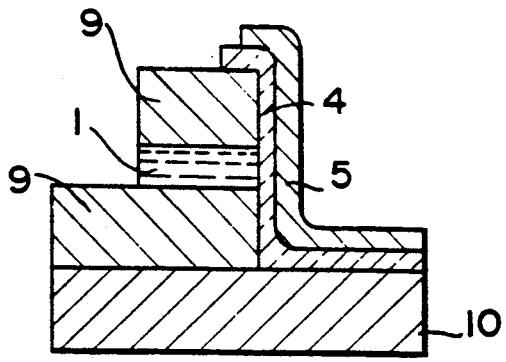
FIG. 39 is a cross-sectional view of a device of the 15th embodiment of the present invention.

Next, the 15th embodiment of the present invention is explained with reference to FIG. 39. A (110) SrTiO$_3$ substrate was used as substrate 10. An oxide superconducting thin film of Y—Ba—Cu—O of 2000Å in thickness was formed as superconducting electrode 9 on the substrate by sputtering at a substrate temperature of 600° C., and Nb-doped SrTiO$_3$ 1 of 1000Å in thickness was formed on the film in the same manner as in the 14th embodiment of the present invention. An oxide superconducting thin film of Y—Ba—Cu—O of about 2000Å in thickness was formed on the Nb-doped SrTiO$_3$ 1 by sputtering at a substrate temperature of 600° C. to obtain a superconducting electrode 9. Then, patterning was performed using an AZ type resist, followed by processing by dry etching. Subsequently, SiO$_2$ was formed into film of 200Å in thickness by a CVD method to obtain a gate insulating film 4, and polycrystalline silicon was formed thereon by a CVD method to obtain a gate electrode 5. In order to pass a supercurrent between the superconducting electrodes 9 by superconducting proximity effect, the distance between them via the semiconductor is adjusted to 1 μm or less. The coherence length $\xi_n$ in the semiconductor is inversely proportional to one-half power of the temperature. Therefore, for example, in order to operate the device at liquid nitrogen temperature by the use of the oxide superconductor, the distance between the superconducting electrodes 9 via the semiconductor should be adjusted to about a quarter of that employed for operating the device at liquid helium temperature. Therefore, the present embodiment in which the superconducting electrodes 9 and the Nb-doped SrTiO$_3$ 1 were laminated, is characterized in that the reduction of the distance between the superconducting electrodes via the semiconductor and hence the production of the device are easier than in the 14th embodiment of the present invention because the film thickness of the Nb-doped SrTiO$_3$ 1 can easily be reduced.

Figure 40:
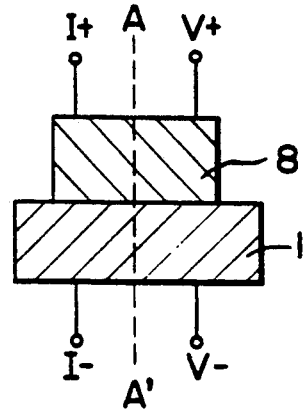
FIG. 40 is a cross-sectional view of a device of the 16th, embodiment of the present invention.
Figure 41:
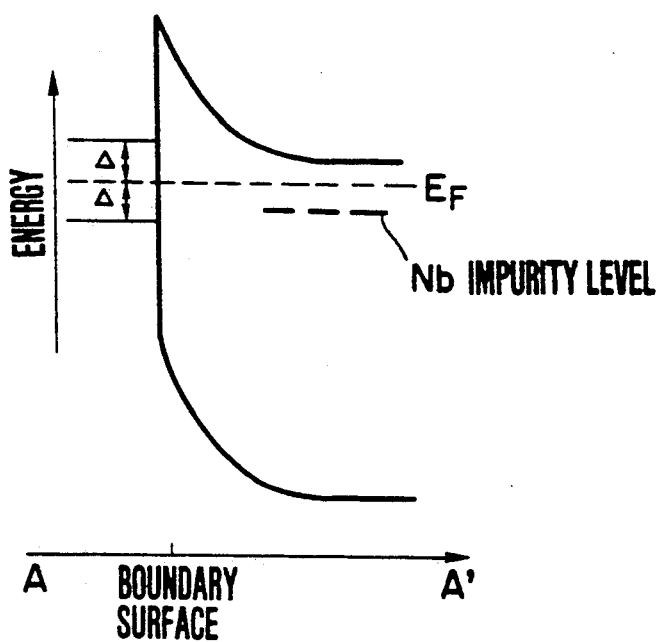
FIG. 41 is a diagram showing the energy band of the 16th embodiment of the present invention.
Figure 42:
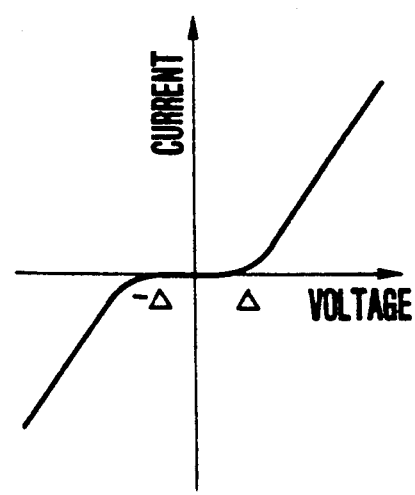
FIG. 42 is a current-voltage characteristic diagram of the device of the 16th embodiment of the present invention.

Next, the 16th embodiment of the present invention is explained below with reference to FIGS. 40 to 42. This embodiment is concerned with a super-Schottky diode. A SrTiO$_3$ single crystal was grown from a starting material incorporated with an impurity Nb in an amount of 0.04 wt %, and cut in (110) plane orientation. Thus, Nb-doped SrTiO$_3$ was made into an insulator 1 in which carriers had been generated. This Nb-doped SrTiO$_3$ had a carrier concentration of about $5 \times 10^{18}$ 1/cm$^3$ and a mobility of about 5 cm$^2$/V.sec at room temperature. For producing a Schottky diode, a low carrier concentration is sufficient when the thermoionic emission phenomenon is utilized, but a high carrier concentration is necessary when the tunnel phenomenon is utilized. Therefore, the amount of the impurity incorporated into the starting material should be varied depending on purposes but is sufficient when it is in the range of about 0.0001 wt % to about 5 wt %. Particularly in the present embodiment, the tunnel phenomenon is utilized and hence the amount of the impurity added as doping material should be large. Then, an oxide superconducting thin film of Y—Ba—Cu—O of 1 μm in thickness was formed on the insulator 1 in which carriers had been generated, by a reactive evaporation method at a substrate temperature of 500° C., whereby an oxide superconductor 8 was formed. Subsequently, gold was deposited by evaporation by the use of a metal mask for obtaining an ohmic contact, and the oxide superconductor 8 was provided with an electric current probe I+ and a voltage probe V+. FIG. 41 is a diagram showing energy band between A and A' in FIG. 40. At a temperature lower than the critical temperature for superconductivity, the oxide superconductor 8 transfers to superconducting state and a superconducting energy gap 2Δ is caused. Since the insulator 1 in which carriers had been generated was composed of Nb-doped SrTiO$_3$, the Fermi level $E_F$ is situated between the lower end of the conduction band and the Nb impurity level. Therefore, the energy band of SrTiO$_3$ is bent. The degree of the bending depends on the amount of the impurity: the larger the amount of the impurity, the higher the degree of the bending. Various oxide superconducting devices can be designed by utilizing the degree of the bending. In the present embodiment, since SrTiO$_3$ was doped with a large amount of an impurity Nb, the degree of the band bending is high, namely, the width of Schottky barrier is small. Accordingly, carriers can tunnel between the oxide superconductor 8 and the insulator 1 in which the carriers had been generated. The current-voltage characteristic at liquid nitrogen temperature in the present embodiment is shown in FIG. 42. The conductance begins to change from voltages of about ±Δ, and from this fact working of the super-Schottky diode can be confirmed.

As described above, according to the present invention, carriers are generated in an insulator which enables an oxide superconductor to exhibit superconductivity, and therefore an oxide superconducting device comprising an oxide superconductor and a semiconductor combined thereto can be realized.

We claim:

1. An oxide superconducting device comprising at least a junction structure comprising at least one oxide superconductor and at least one solid material which has inherent insulative characteristics in which charge carriers have been generated,
wherein the crystal structure of said solid material is either a perovskite type crystal structure or a pseudoperovskite type crystal structure, wherein ion(s) constituting a B site of either the perovskite type crystal structure or the pseudoperovskite type crystal structure is ion(s) of at least one element selected from the element group consisting of Ga, Ta, Nb and Al.

2. An oxide superconducting device comprising first and second junction structures each composed of at least one oxide superconductor and at least one insulator in which carriers have been generated, the current-voltage characteristic of the first junction structure being linear, and the current-voltage characteristic of the second junction structure being Schottky characteristics.

3. An oxide superconducting device comprising at least a junction structure comprising at least one oxide superconductor and at least one solid material which has inherent insulative characteristics in which charge carriers have been generated wherein said solid materials exhibits superconducting characteristics from a superconducting proximity effect, wherein the crystal structure of the solid material is either a perovskite type crystal structure or a pseudoperovskite type crystal structure, and wherein the solid material is an oxide of a rare earth element and gallium.

4. An oxide superconducting device according to claim 3, wherein the oxide of a rare earth element and gallium is $LaGaO_3$ or $NdGaO_3$.

5. An oxide superconducting device according to claim 3, wherein said solid material in which carriers have been generated is a solid material doped with at least one impurity, and the impurity is selected from the element group consisting of Co, Cu, Mn and Ni.

6. An oxide superconducting device according to claim 3, wherein said solid material in which carriers have been generated is a solid material doped with at least one impurity, and the impurity is selected from the element group consisting of Ir, Ge, Nb, Ru, Ti, Pb, and Bi.

7. An oxide superconducting device according to claim 3, wherein said solid material in which carriers have been generated is a solid material doped with at least one impurity, and the impurity is selected from the element group consisting of Mg, Ca, Sr and Ba.

8. An oxide superconducting device comprising at least a junction structure comprising at least one oxide superconductor and at least one insulator in which carriers have been generated,
wherein the crystal structure of the insulator is either a perovskite type crystal structure or a pseudoperovskite type crystal structure and wherein the insulator is an oxide of a rare earth element and gallium.

9. An oxide superconducting device according to claim 8 wherein the oxide of a rare earth element and the gallium is $LaGaO_3$ or $NdGaO_3$.

10. An oxide superconducting device according to claim 8 wherein said insulator is doped with at least one impurity and the impurity is selected from the element group consisting of Co, Cu, Mn and Ni.

11. An oxide superconducting device according to claim 8 wherein said insulator is doped with at least one impurity and the impurity is selected from the element group consisting of Ir, Ge, Nb, Ru, Ti, Pb and Bi.

12. An oxide superconducting device according to claim 8 wherein said insulator is doped with at least one impurity and the impurity is selected from the element group consisting of Mg, Ca, Sr and Ba.

13. An oxide superconducting device comprising at least a junction structure comprising at least one oxide superconductor and at least one solid material which has inherent insulative characteristics in which charge carriers have been generated wherein said solid materials exhibits superconducting characteristics from a superconducting proximity effect, wherein the crystal structure of the solid material is either a perovskite type crystal structure or a pseudoperovskite type crystal structure, and wherein the solid material is selected from the group consisting of $LaAlO_3$ and $AlGaO_3$.

14. An oxide superconducting device comprising at least a junction structure comprising at least one oxide superconductor and at least one insulator in which carriers have been generated, wherein the crystal structure of the insulator is either a perovskite type crystal structure or a pseudoperovskite type crystal structure and wherein the insulator is selected from a compound group consisting $LaAlO_3$ and $AlGaO_3$.

15. An oxide superconducting device comprising at least a junction structure comprising at least one oxide superconductor and at least one solid material which has inherent insulative characteristics in which charge carriers have been generated wherein said solid materials exhibits superconducting characteristics from a superconducting proximity effect, wherein the crystal structure of the solid material is either a perovskite type crystal structure or a pseudoperovskite type crystal structure, and wherein the solid material is selected from the group consisting of $KTaO_3$ and $LiNbO_3$.

16. An oxide superconducting device comprising at least a junction structure comprising at least one oxide superconductor and at least one insulator in which carriers have been generated, wherein the crystal structure of the insulator is either a perovskite type crystal structure or a pseudoperovskite type crystal structure, and wherein the insulator is selected from a compound group consisting of $KTaO_3$ and $LiNbO_3$.

17. An oxide superconducting device comprising at least a junction structure comprising at least one oxide superconductor and at least one solid material which has inherent insulative characteristics in which charge carriers have been generated wherein said solid materials exhibits superconducting characteristics from a superconducting proximity effect, wherein the crystal structure of the solid material is either a perovskite type crystal structure or a pseudoperovskite type crystal structure, and the solid material is $SrTiO_3$, wherein the solid material in which carriers have been generated is $SrTiO_3$, doped with at least one member selected from the element group consisting of Sc, Al, Ga, In and P.

18. An oxide superconducting device comprising at least a junction structure comprising at least one oxide superconductor and at least one insulator in which carriers have been generated, wherein the crystal structure of the insulator is either a perovskite type crystal structure or a pseudoperovskite type crystal structure, wherein the insulator is $SrTiO_3$ and is doped with at least one member selected from the element group consisting of Sc, Al, Ga, In and P.

19. An oxide superconducting device comprising at least a junction structure comprising at least one oxide superconductor and at least one solid material which has inherent insulative characteristics in which charge carriers have been generated wherein said solid materials exhibits superconducting characteristics from a superconducting proximity effect, wherein the crystal structure of the solid material is either a perovskite type crystal structure or a pseudoperovskite type crystal structure, and the solid material is $SrTiO_3$, wherein the solid material in which carriers have been generated is $SrTiO_3$, doped with at least one element selected from rare earth elements.

20. An oxide superconducting device comprising at least a junction structure comprising at least one oxide superconductor and at least one insulator in which carriers have been generated, wherein the crystal structure of the insulator is either a perovskite type structure or a pseudoperovskite type crystal structure, wherein the insulator is $SrTiO_3$ and is doped with at least one element selected from rare earth elements.

21. An oxide superconducting device comprising at least a laminated structure composed of at least one oxide superconductor, at least one buffer film and at least one solid material which has inherent insulative characteristics in which carriers have been generated, said solid material being selected from the compound group consisting $LaGaO_3$, $NdGaO_3$, $LaAlO_3$, $KTaO_3$ and $LiNbO_3$, and said buffer film being a film of an element selected from the element group consisting of Au, Ag, Pt and Pd.

22. An oxide superconducting device comprising at least a junction structure comprising at least one oxide superconductor and at least one solid material which has inherent insulative characteristics in which charge carriers have been generated wherein said solid materials exhibits superconducting characteristics from a superconducting proximity effect and wherein the solid material in which carriers have been generated has a junction structure composed of n-type and p-type.

23. An oxide superconducting device comprising at least a junction structure comprising at least one oxide superconductor and at least one insulator in which carriers have been generated wherein the insulator has a junction structure composed of n-type and p-type materials.

24. An oxide superconducting device comprising at least a junction structure comprising at least one oxide superconductor and at least one solid material which has inherent insulative characteristics in which charge carriers have been generated,
wherein the crystal structure of said solid material is either a perovskite type crystal structure or a pseudoperovskite type crystal structure, wherein ion(s) constituting a B site of either the perovskite type crystal structure or the pseudoperovskite type crystal structure is ion(s) of Ti, and said solid material doped with at least one impurity except Nb.

25. An oxide superconducting device comprising at least a junction structure comprising at least one oxide superconductor and at least one solid material which has inherent insulative characteristics in which charge carriers have been generated,
wherein said solid material is $SrTiO_3$, doped with at least one member selected from the element group consisting of V, Ta, Mo, W, As, Sb and Bi.

26. An oxide superconducting device comprising at least a laminated structure including at least one oxide superconductor, at least one buffer film and at least one solid material which has inherent insulative characteristics in which charge carriers have been generated, said solid material being $SrTiO_3$, doped with at least one impurity except Nb, and said buffer film, being disposed between said at least one oxide superconductor and said solid material being a film of an element selected from the element group consisting of Au, Ag, Pt and Pd.

27. An oxide superconducting device comprising at least a junction structure comprising at least one oxide superconductor and at least one solid material which has inherent insulative characteristics in which charge carriers have been generated,
wherein said solid material is $SrTiO_3$, doped with Nb, and the carrier concentration of said solid material is $1 \times 10^{21}$ ($1/cm^3$) or less at a temperature of 300° K.

28. An oxide superconducting device comprising at least a laminated structure including at least one oxide superconductor, at least one buffer film and at least one solid material which has inherent insulative characteristics in which charge carriers have been generated, said solid material being $SrTiO_3$, doped with Nb and the carrier concentration of said solid material is $1 \times 10^{21}$ ($1/cm^3$) or less at a temperature of 300° K., and said buffer film, being disposed between said at least one oxide superconductor and said solid material, being a film of an element selected from the element group consisting of Au, Ag, Pt and Pd.

* * * * *

UNITED STATES PATENT AND TRADEMARK OFFICE
CERTIFICATE OF CORRECTION

PATENT NO.  : 5,256,897
DATED       : October 26, 1993
INVENTOR(S) : Haruhiro Hasegawa et al.

It is certified that error appears in the above-indentified patent and that said Letters Patent is hereby corrected as shown below:

| Column | Line | |
|---|---|---|
| 4 | 1 | Change "1 x 10" to --1 x $10^{22}$--. |
| 4 | 24 | Change "is" to --are--. |
| 4 | 41 | Before "Schottky" insert --A--. |
| 5 | 10 | Change "rier" to --riers--. |
| 5 | 25 | Change "IEE" to --IEEE--. |
| 5 | 41 | Change "(superconducting base semiconductor isolated" to --(superconducting base semiconductor isolated--. |
| 5 | 42 | Change "transistor) or SUBHET (superconducting base hot elec-" to --transistor) or SUBHET (superconducting base hot elec- --. |
| 5 | 43 | Change "transistor)," to --transistor),--. |

UNITED STATES PATENT AND TRADEMARK OFFICE
CERTIFICATE OF CORRECTION

PATENT NO. : 5,256,897
DATED : October 26, 1993
INVENTOR(S) : Haruhiro Hasegawa et al.

Figure 12:
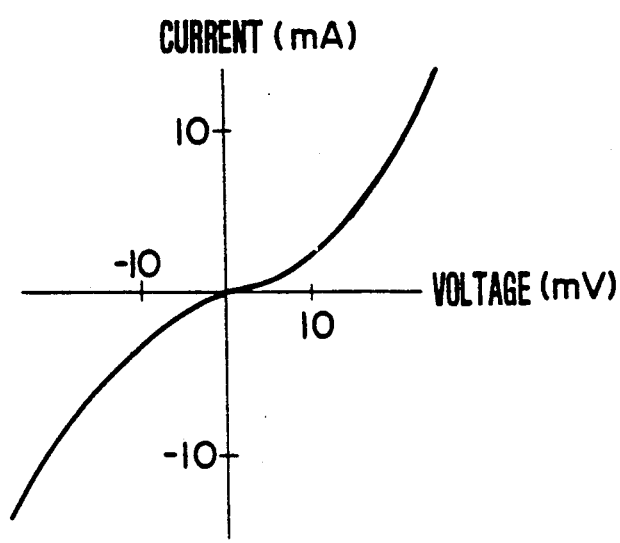

It is certified that error appears in the above-indentified patent and that said Letters Patent is hereby corrected as shown below:

| Column | Line | Corrections |
|--------|------|-------------|
| 7 | 67 | Change "was" to --were--. |
| 8 | 52 | Change "10$^{21}$" to --10$^{21}$--. |
| 9 | 31 | After "voltage" delete "of". |
| 9 | 56 | Change "(phosphosilicate glass)" to --(pho<u>s</u>phosilicate glass)--. |
| 9 | 67 | Change "At" to --As--. |
| 10 | 55 | Change "an" to --a--. |
| 12 | 8 | Change "earthened." to --grounded.--. |
| 12 | 28 | Change "FIG. 9 and FIG. 12" to --FIGS. 9 to 12--. |
| 13 | 5 | Change "permit" to --permits--. |
| 14 | 21 | Change "thermoionic" to --thermionic--. |
| 14 | 61 | Change "10" to --10--. |
| 15 | 47 | Change "by" to --be--. |

UNITED STATES PATENT AND TRADEMARK OFFICE
CERTIFICATE OF CORRECTION

PATENT NO. : 5,256,897
DATED : October 26, 1993
INVENTOR(S) : Haruhiro Hasegawa et al.

It is certified that error appears in the above-indentified patent and that said Letters Patent is hereby corrected as shown below:

| Column | Line | Corrections |
|--------|------|-------------|
| 16 | 8 | Change "and" to --an--. |
| 17 | 37 | Change "Fig. 23" to --FIGS. 23(a) to (c)--. |
| 17 | 56 | Change "after" to --other--. |
| 17 | 57 | Change "Can" to --can--. |
| 19 | 48 | Change "thermoionic" to --thermionic--. |
| 21 | 22 | Change "replace" to --replaces--. |
| 23 | 4 | Change "35." to --35(a) to (c).--. |
| 23 | 43 | Change "be" to --been--. |
| 23 | 56 | Before "remained" delete "was". |
| 23 | 65 | Change "100°" to --1100°--. |
| 25 | 1 | Change "SrTiO$_2$" to --SrTiO$_3$--. |

Page 3 of 4

UNITED STATES PATENT AND TRADEMARK OFFICE
CERTIFICATE OF CORRECTION

PATENT NO. : 5,256,897
DATED : October 26, 1993
INVENTOR(S) : Haruhiro Hasegawa et al.

It is certified that error appears in the above-indentified patent and that said Letters Patent is hereby corrected as shown below:

| Column | Line | Corrections |
|---|---|---|
| 26 | 24 | Change "thermoionic" to --thermionic--. |
| 29 | 33 | After "consisting" insert --of--. |
| 29 | 33 | Before "LaAlO$_3$," insert --AlGaO$_3$,--. |

Signed and Sealed this

Eighteenth Day of April, 1995

Attest:

BRUCE LEHMAN

Attesting Officer

Commissioner of Patents and Trademarks